United States Patent
Kim et al.

(10) Patent No.: US 9,552,256 B2
(45) Date of Patent: *Jan. 24, 2017

(54) SEMICONDUCTOR MEMORY DEVICE INCLUDING NON-VOLATILE MEMORY, CACHE MEMORY, AND COMPUTER SYSTEM

(71) Applicant: Samsung Electronics Co., Ltd., Suwon-si, Gyeonggi-do (KR)

(72) Inventors: Sun-gyeum Kim, Goyang-si (KR); Hyeok-man Kwon, Suwon-si (KR); Young-jun Kwon, Seongnam-si (KR); Ki-young Choi, Seoul (KR); Jun-whan Ahn, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/978,538

(22) Filed: Dec. 22, 2015

(65) Prior Publication Data

US 2016/0110253 A1 Apr. 21, 2016

Related U.S. Application Data

(63) Continuation of application No. 13/790,113, filed on Mar. 8, 2013, now Pat. No. 9,250,997.

(30) Foreign Application Priority Data

Nov. 27, 2012 (KR) .................. 10-2012-0135558

(51) Int. Cl.
*G11C 29/00* (2006.01)
*G06F 11/10* (2006.01)
*G11C 29/52* (2006.01)

(52) U.S. Cl.
CPC ....... *G06F 11/1068* (2013.01); *G06F 11/1064* (2013.01); *G11C 29/52* (2013.01)

(58) Field of Classification Search
CPC ......................... G06F 11/1068; G11C 29/52
See application file for complete search history.

(56) References Cited

U.S. PATENT DOCUMENTS

| | | |
|---|---|---|
| 6,704,230 B1 | 3/2004 | DeBrosse et al. |
| 7,191,379 B2 | 3/2007 | Adelmann et al. |

(Continued)

FOREIGN PATENT DOCUMENTS

KR  2009-0127643 A  12/2009

OTHER PUBLICATIONS

Hongbin Sun et al., "Design Techniques to Improve the Device Write Margin for MRAM-based Cache Memory", May 2011, pp. 97-102.

(Continued)

*Primary Examiner* — Sam Rizk
(74) *Attorney, Agent, or Firm* — Harness, Dickey & Pierce, P.L.C.

(57) ABSTRACT

In one embodiment, the memory device includes a data storage region and an error correction (ECC) region. The data storage region configured to store a first number of data blocks. The ECC region is configured to store a second number of ECC blocks. Each of the second number of ECC blocks is configured to store ECC information. The second number of the ECC blocks is associated with the first number of data blocks, and the second number is less than the first number.

18 Claims, 20 Drawing Sheets

(56) References Cited

U.S. PATENT DOCUMENTS

| | | | |
|---|---|---|---|
| 7,231,580 B2 | 6/2007 | Shiota et al. | |
| 7,240,275 B2 | 7/2007 | Smith et al. | |
| 7,370,260 B2 | 5/2008 | Nahas | |
| 9,189,329 B1 * | 11/2015 | Zhu | G06F 11/1048 |
| 2003/0023922 A1 | 1/2003 | Davis et al. | |
| 2004/0015771 A1 | 1/2004 | Lasser et al. | |
| 2007/0226592 A1 | 9/2007 | Radke | |
| 2008/0313493 A1 | 12/2008 | Roohparvar et al. | |
| 2009/0319870 A1 | 12/2009 | Yamada et al. | |
| 2009/0327833 A1 | 12/2009 | Suto | |
| 2012/0079351 A1 | 3/2012 | Cideciyan et al. | |
| 2012/0173956 A1 | 7/2012 | Jeon et al. | |

OTHER PUBLICATIONS

Tai Min et al., "*A Study of Write Margin of Spin Torque Transfer Magnetic Random Access Memory Technology*", IEEE Transactions on Magnetics, vol. 46, No. 6, Jun. 2010, pp. 2322-2327.

Wujie Wen et al., "*PS3-RAM: A Fast Portable and Scalable Statistical STT-RAM Reliability Analysis Method*", Jun. 2012, pp. 1187-1192.

* cited by examiner

FIG. 15A

| Page1 | Data | ECC |
|---|---|---|
| Page2 | Data | ECC |
| Page3 | Data | ECC |
| ⋮ | ⋮ MRAM Cell Array | |

FIG. 15B

| Page1 | DB1 | DB2 | ... | DBn | E1 | ... | Em |
|---|---|---|---|---|---|---|---|

FIG. 15C

| Page1 | Data1 | ECC1 |
|---|---|---|
| Page2 | Data2 | |
| Page3 | Data3 | ECC2 |
| ⋮ | ⋮ | ⋮ |

SEMICONDUCTOR MEMORY DEVICE INCLUDING NON-VOLATILE MEMORY, CACHE MEMORY, AND COMPUTER SYSTEM

CROSS-REFERENCE TO RELATED APPLICATIONS

This application is a divisional of U.S. application Ser. No. 13/790,113, filed Mar. 8, 2013 which claims the benefit of Korean Patent Application No. 10-2012-0135558, filed on Nov. 27, 2012, in the Korean Intellectual Property Office, the disclosure each of which is incorporated herein in its entirety by reference.

BACKGROUND

The inventive concepts relate to a semiconductor memory device, and more particularly, to a semiconductor memory device including a non-volatile memory, a cache memory and a computer system including the semiconductor memory device.

A non-volatile memory device as a semiconductor memory device stores data in a non-volatile manner. As an example of a non-volatile memory device, a magnetic random access memory (MRAM) device stores data in a non-volatile manner and has a quick access speed. It is desirable for the semiconductor memory device to have improved integration and, access speed and data reliability.

In consideration of a quick access speed of an MRAM device, the MRAM device may be used for storing important data as a system memory, for example. Accordingly, it is desirable for the MRAM device to have improved data reliability while maintaining a quick access speed.

SUMMARY

At least one embodiment relates to a memory device.

In one embodiment, the memory device includes a data storage region and an error correction (ECC) region. The data storage region configured to store a first number of data blocks. The ECC region is configured to store a second number of ECC blocks. Each of the second number of ECC blocks is configured to store ECC information. The second number of the ECC blocks is associated with the first number of data blocks, and the second number is less than the first number.

In one embodiment, the ECC region is configured to store validity information for each of the second number of ECC blocks, and the validity information indicates whether a corresponding ECC block is valid.

In one embodiment, the ECC region is configured to store block identification information for each of the second number of ECC blocks, and the block identification information indicates to which of the first number of data blocks an associated one of the ECC blocks corresponds.

In one embodiment, the ECC region is configured to store timing information for each of the second number of ECC blocks, and the timing information indicates an age of an associated one of the ECC blocks relative to others of the ECC blocks.

In one embodiment, the ECC region includes a plurality of memory cell arrays, and the second number of ECC blocks, the validity information and the block identification information are stored in different ones of the plurality of memory cell arrays.

In one embodiment, the second number of ECC blocks, the validity information and the block identification information are linked.

In one embodiment, the second number of ECC blocks, the validity information and the block identification information are linked based on how the second number of ECC blocks, the validity information and the block identification information are indexed in their respective memory cell arrays.

In one embodiment, the ECC region is configured to store block identification information for each of the second number of ECC blocks, the block identification information indicating to which of the first number of data blocks an associated one of the ECC blocks corresponds.

In one embodiment, the memory device further includes an access circuit configured to write to and read from the data storage region and the ECC region. The access circuit is configured to receive a request to read one of the first number of data blocks, read the requested data block, determine from the block identification information if one of the second number of ECC blocks is associated with the requested data block; and if one of the second number of ECC blocks is associated with the requested data block, reading the associated ECC block and performing error correction on the read data block using the read ECC block.

In one embodiment, the second number is one.

In one embodiment, the first number of data blocks and the second number of ECC blocks form a page.

In one embodiment, the data storage region and the ECC region include a plurality of memory cells, and the plurality of memory cells include MRAM memory cells.

In one embodiment, the memory device may be a cache.

In one embodiment, the data storage region is n-way set associative, where n is the first number.

In one embodiment, the memory device further includes an access circuit configured to write to and read from the data storage region and the ECC region. The access circuit is configured to receive a request to write received data to a selected one of the first number of data blocks, determine if an invalid error correction (ECC) block in the second number of ECC blocks exists in response to the request; and if an invalid ECC block does not exist, removing errors from data in another of the first data blocks such that no errors in reading the another data block exist, invalidate the ECC block associated with the another data block, write the received data in the selected data block, write ECC data associated with the received data into the invalidated ECC block, and change a state of the invalidated ECC block to valid.

In one embodiment, in changing the state of the invalidated ECC block, the access circuit is configured to store validity information in association with the invalidated ECC block.

In one embodiment, if an invalid ECC block does not exist, the access circuit is configured to store block identification information in association with the valid ECC block, the block identification information indicating to which of the first number of data blocks the valid ECC block corresponds.

In one embodiment, if an invalid ECC block does not exist, the access circuit is configured to store timing information in association with the valid ECC block, the timing information indicating an age of an associated one of the ECC blocks relative to others of the ECC blocks.

In one embodiment, the timing information is a count value, and the storing timing information includes changing the count value associated with other valid ECC blocks.

In one embodiment, in the removing errors, the access circuit is configured to remove errors from one of the first number of data blocks associated with one of the ECC block having a highest count value.

In one embodiment, in the removing errors, the access circuit is configured to remove errors from a one of the first number of data blocks corresponding to an oldest ECC block as indicated by the timing information.

In one embodiment, in the removing errors, the access circuit is configured to randomly selects the another data block.

In one embodiment, if an invalid ECC block does exist, the access circuit is configured to, write the received data to the selected data block, write ECC data associated with the received data to an invalid one of the ECC blocks, determine if the written data includes errors, and invalidate the ECC block in which the ECC data was written if the determining determines that the written data does not include errors.

In one embodiment, if the access circuit determines the written data does include errors, the access circuit is configured to determine if the errors are not correctable by the ECC data, and correct at least one of the errors in the written data if the errors are determined not to be correctable.

In one embodiment, the access circuit is configured to validate the ECC block if the errors are determined to be correctable.

In one embodiment, the memory device further includes an access circuit configured to write to and read from the data storage region and the ECC region. The access circuit is configured to receive a request to write received data to a selected one of the first number of data blocks, write the received data to the selected data block, write ECC data associated with the received data to one of the second number of ECC blocks, determine if the written data includes errors that are not correctable by the ECC data, and correct at least one of the errors in the written data if the errors are determined not to be correctable.

At least one embodiment relates to a method of reading data.

In one embodiment, the method includes receiving a request to read data from one of a first number of data blocks, reading the requested data block in response to the request, and determining from block identification information if one of a second number of ECC blocks is associated with the requested data block, the second number being less than the first number. If one of the second number of ECC blocks is associated with the requested data block, the method further includes reading the associated ECC block, and performing error correction on the read data block using the read ECC block.

At least one embodiment relates to a method of storing data.

In one embodiment, the method includes receiving a request to write received data to a selected one of a first number of data blocks, and determining if an invalid error correction (ECC) block in a second number of ECC blocks exists in response to the request, the second number of data blocks being associated with the first number of data blocks. If an invalid ECC block does not exist, the method further includes removing errors from data in another of the first number of data blocks such that no errors in reading the another data block exist, invalidating the ECC block associated with the another data, writing the received data in the selected data block, writing ECC data associated with the received data into the invalidated ECC block, and changing a state of the invalidated ECC block to valid.

In one embodiment, the second number is less than the first number.

In one embodiment, the changing stores validity information in association with the invalidated ECC block.

In one embodiment, if an invalid ECC block does not exist, the method further includes storing block identification information in association with the valid ECC block, the block identification information indicating to which of the first number of data blocks the valid ECC block corresponds.

In one embodiment, if an invalid ECC block does not exist, the method further includes storing timing information in association with the valid ECC block, the timing information indicating an age of an associated one of the ECC blocks relative to others of the ECC blocks.

In one embodiment, the timing information is a count value, and the storing timing information includes changing the count value associated with other valid ECC blocks.

In one embodiment, the removing removes errors from one of the first number of data blocks associated with one of the ECC block having a highest count value.

In one embodiment, the removing removes errors from a one of the first number of data blocks corresponding to an oldest ECC block as indicated by the timing information.

In one embodiment, the removing randomly selects the another data block.

In one embodiment, if an invalid ECC block does exist, the method further includes writing the received data to the selected data block, writing ECC data associated with the received data to an invalid one of the ECC blocks, determining if the written data includes errors, and invalidating the ECC block in which the ECC data was written if the determining determines that the written data does not include errors.

In one embodiment, if the determining determines the written data does include errors, the method further includes determining if the errors are not correctable by the ECC data, and correcting at least one of the errors in the written data if the errors are determined not to be correctable.

In one embodiment, the method further includes validating the ECC block if the errors are determined to be correctable.

Another embodiment of the method of storing data includes receiving a request to write received data to a selected one of a first number of data blocks, writing the received data to the selected data block, writing ECC data associated with the received data to one of a second number of ECC blocks, determining if the written data includes errors that are not correctable by the ECC data, and correcting at least one of the errors in the written data if the errors are determined not to be correctable.

In one embodiment, the second number is less than the first number.

BRIEF DESCRIPTION OF THE DRAWINGS

Example embodiments of the inventive concepts will be more clearly understood from the following detailed description taken in conjunction with the accompanying drawings in which:

FIGS. 15A, 15B, and 15C are block diagrams schematically illustrating an example of an MRAM device according to another example embodiment of the present inventive concepts;

DETAILED DESCRIPTION OF THE EMBODIMENTS

Figure 1:
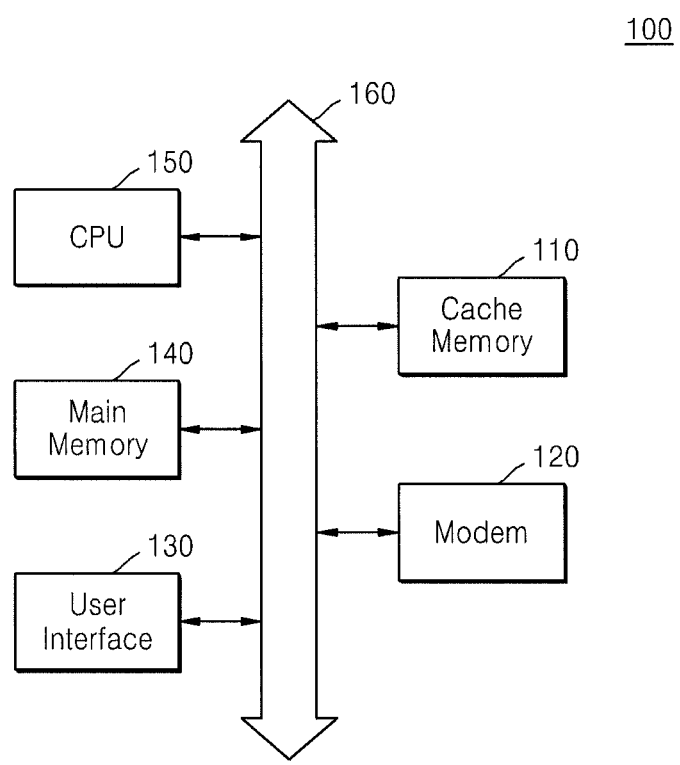
FIG. 1 is a block diagram schematically illustrating a computer system according to an example embodiment of the present inventive concepts.

Example embodiments will now be described more fully with reference to the accompanying drawings. However, example embodiments may be embodied in many different forms and should not be construed as being limited to the example embodiments set forth herein. Example embodiments are provided so that this disclosure will be thorough, and will fully convey the scope to those who are skilled in the art. In some example embodiments, well-known processes, well-known device structures, and well-known technologies are not described in detail to avoid the unclear interpretation of the example embodiments. Throughout the specification, like reference numerals in the drawings denote like elements.

It will be understood that when an element or layer is referred to as being "on", "connected to" or "coupled to" another element or layer, it may be directly on, connected or coupled to the other element or layer, or intervening elements or layers may be present. In contrast, when an element is referred to as being "directly on," "directly connected to" or "directly coupled to" another element or layer, there may be no intervening elements or layers present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a", "an" and "the" may be intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram schematically illustrating a computer system 100 according to an example embodiment of the present inventive concepts. Referring to FIG. 1, the computer system 100 such as a mobile device and a desktop computer may include a cache memory 110, a modem 120, a user interface 130, a main memory 140, and a central processing unit (CPU) 150, which are electrically connected to a system bus 160. The cache memory 110 is a memory for temporarily storing part of data that is stored in the main memory 140. The cache memory 110 is able to quickly access data that has been used by the main memory 140 or a disk (not shown) by using locality occurring when a program is executed.

A semiconductor memory device according to the present inventive concepts may be applied to the main memory 140 or the cache memory 110 of the computer system 100. For example, a non-volatile memory device that stores data in a non-volatile manner may be used as the semiconductor memory device. Also, the non-volatile memory device may be as a phase change random access memory (PRAM) using a phase change material, a resistive random access memory (RRAM) using a variable resistance material such as complex metal oxides, a magnetic random access memory (MRAM) using a ferromagnetic material, and a ferroelectric random access memory (FRAM) using a ferroelectric capacitor.

In the following description, an example of using an MRAM or a spin torque transfer MRAM (STT-MRAM), as a non-volatile memory device, is described below. However, the present inventive concepts are not limited thereto and the above-described various types of non-volatile memory devices may be used therefore. Also, the MRAM applied to the main memory 140 or the cache memory 110 may include an MRAM device including an MRAM cell array and a controller (for example, an MRAM controller) for controlling the MRAM device. Accordingly, the main memory 140 or the cache memory 110 according to the present example embodiment may be described as being embodied by an MRAM system including the MRAM device and the controller. The main memory 140 or the cache memory 110 may be embodied by an MRAM device including an MRAM cell array and the function of a controller to control the MRAM device may be provided in the CPU 150. In the following description, it is described that the main memory 140 or the cache memory 110 includes an MRAM. The MRAM may refer to an MRAM system or the MRAM device.

Of non-volatile memories, the MRAM has a relatively quick access speed and thus it may be highly likely to be used as a main memory or a cache memory in the computer system 100. As a degree of integration of the MRAM increases, the size of an MRAM cell may be decreased and thus a level of a write voltage during a write operation may also be lowered according thereto. When the MRAM is used as a main memory or a cache memory, it is desirable to improve reliability in the write operation. As a policy to improve reliability, a data error correction using an error correction code (ECC) may be used. When an ECC policy is used, ECC parity is calculated for data in a desired (or, alternatively a predetermined) unit, for example, an ECC unit. The data and the ECC parity are stored together in a cell array of the MRAM. Then, in a read operation, an error correction operation is performed by using the ECC parity stored in the cell array of the MRAM and thus an error bit may be corrected.

The MRAM according to an example embodiment includes the MRAM cell array and the MRAM cell array includes a region for storing data (hereinafter, referred to as the data region) and a region for storing ECC parity corresponding to the data (hereinafter, referred to as the ECC region). Conventionally, a block of data corresponding to a block of ECC parity may be referred to as a data block, and the block of ECC parity may be referred to as an ECC block. Collectively, the data block and an ECC block may be logically referred to as an ECC unit. In at least one embodiment, the MRAM cell array may include a plurality of data blocks and a plurality of ECC blocks. In particular, the number of ECC blocks is less than the number of data blocks. As an example, m-number of ECC blocks are arranged corresponding to n-number of data blocks. Here, "m" is smaller than "n" and accordingly the m-number of ECC blocks are shared by the n-number of data blocks. An ECC operation according to the present example embodiment, for example, an ECC encoding operation and an ECC decoding operation, is described below in detail.

Figure 2A:
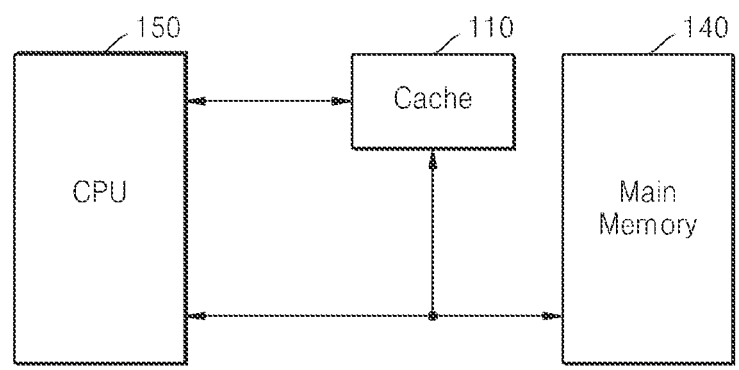
FIGS. 2A and 2B are block diagrams schematically illustrating an example of a cache memory in the computer system of FIG. 1.
Figure 2B:
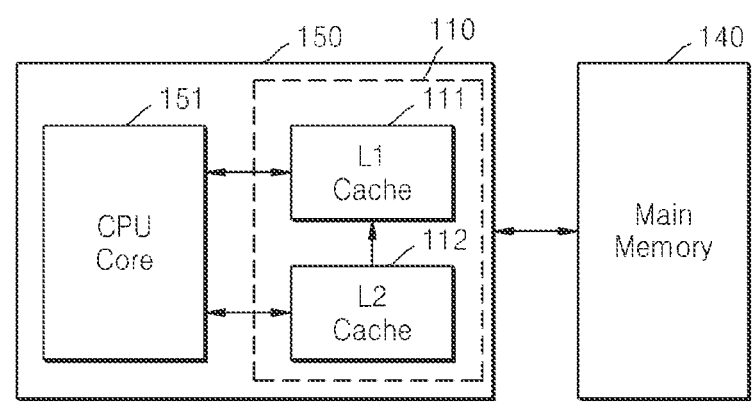

FIGS. 2A and 2B are block diagrams schematically illustrating other examples of a cache memory. As illustrated in FIG. 2A, the cache memory 110 may be arranged between the CPU 150 and the main memory 140. Part of the data stored in the main memory 140 is copied to the cache memory 110 and an address tag indicating the location of the data copied to the cache memory 110 in the main memory 140 is further stored in the cache memory 110. It is determined based on a tag comparison operation whether data requested by the CPU 150 exists in the cache memory 110. When data to which access is requested exists in the cache memory 110, for example, a cache hit, the data in the cache memory 110 is provided to the CPU 150. Otherwise, the requested data does not exist in the cache memory 110, for example, a cache miss, and data of a particular size including the requested data is read out from the main memory 140 and copied to the cache memory 110. Accordingly, the requested data is read out among the copied data and then provided to the CPU 150.

FIG. 2B illustrates an example in which the cache memory 110 is included in the CPU 150. Also, in the example, the cache memory 110 includes at least two caches in the CPU 150, that is, a first cache (L1 cache) 111 that is relatively fast and a second cache (L2 cache) 112 that is relatively slow but has a relatively large capacity. The CPU 150 may further include a CPU core 151 for actually performing processing operations. The MRAM according to the present example embodiment may be applied to at least one of the first and second caches 111 and 112. Also, each of the first and second caches 111 and 112 may include the MRAM device and the controller. Alternatively, while the MRAM device including the MRAM cell array may be embodied in both of the first and second caches 111 and 112, the controller for controlling the MRAM cell array may be embodied in the CPU core 151.

Figure 3:
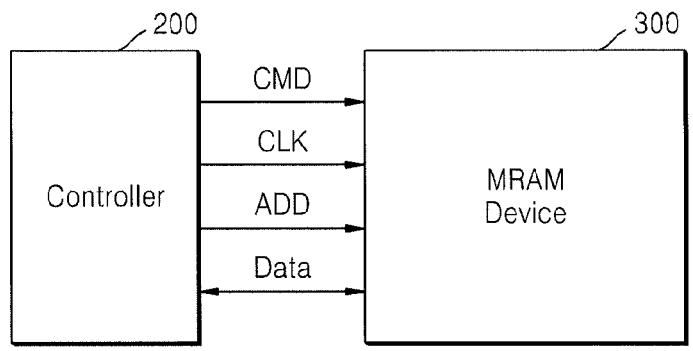
FIG. 3 is a block diagram schematically illustrating an example of an MRAM device included in the cache memory of FIG. 1.

FIG. 3 is a block diagram schematically illustrating an example of an MRAM device included in any one of the cache memories of FIGS. 1-2B. In FIG. 3, it is assumed that the cache memory 110 includes a controller 200 and an MRAM device 300.

Referring to FIG. 3, the controller 200 transmits a command signal CMD, a clock signal CLK, and an address signal ADD and transceives read/write data Data with the MRAM device 300. The MRAM device 300 includes a cell array having a plurality of MRAM cells. Also, the MRAM cells may be embodied by STT-MRAM cells.

Figure 4:
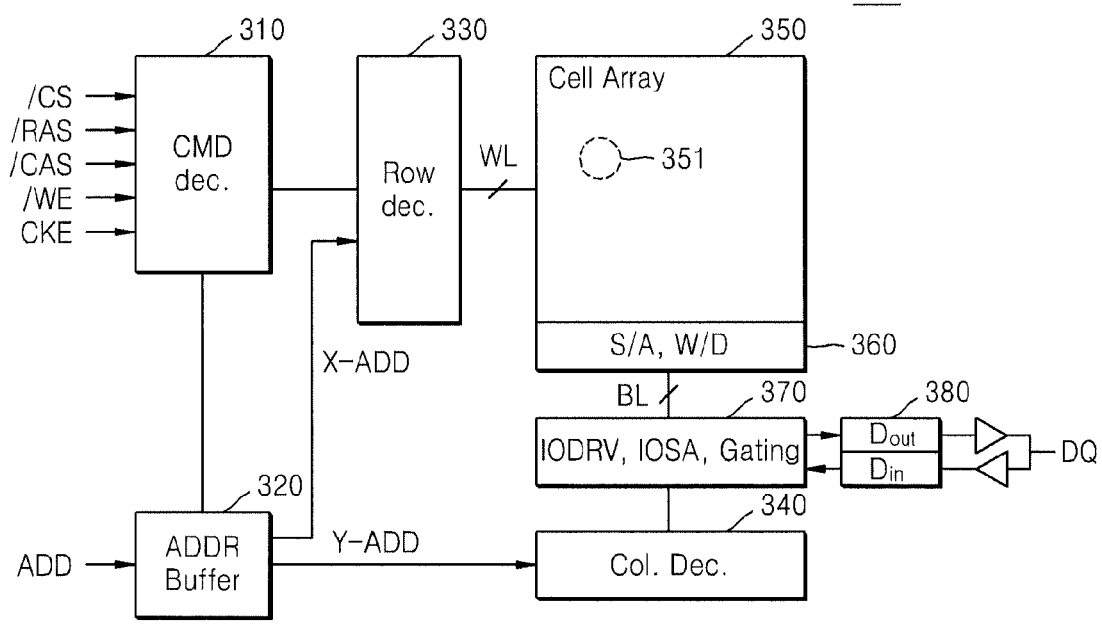
FIG. 4 is a block diagram schematically illustrating the MRAM device of FIG. 3 in detail.

FIG. 4 is a block diagram schematically illustrating the MRAM device 300 of FIG. 3 in detail. As illustrated in FIG. 4, the MRAM device 300 includes a command decoder 310, an address buffer 320, a row decoder 330, a column decoder 340, a cell array 350, a write driver/sense amplifier 360, an input/output driver 370, and a data input/output buffer 380.

The command decoder 310 receives a chip select signal/CS, a row address strobe signal/RAS, a column address strobe signal/CAS, a write enable signal/WE, and a clock enable signal/CKE (collectively referred to as a command CMD) from the controller 200 and performs a decoding operation. After decoding is completed, the MRAM device 300 executes a command from the controller 200.

The address signal ADD received from the controller 200 is stored in the address buffer 320. Then, the address buffer 320 transmits a row address signal X-ADD to the row decoder 330 and a column address signal Y-ADD to the column decoder 340.

Each of the row decoder 330 and the column decoder 340 includes a plurality of switches (not shown). The row decoder 330 is switched in response to the row address signal X-ADD and selects a word line WL. The column decoder 340 is switched in response to the column address signal Y-ADD and selects a bit line BL. The cell array 350 includes a plurality of MRAM cells 351, each disposed at a position where a word line WL and a bit line BL cross each other. For example, the MRAM cell 351 may be a STT-MRAM cell. The MRAM cell 351 is a resistive memory cell having a non-volatile property and has a relatively large or small resistance value according to written data.

During data reading, a data voltage having a different level varying according to the resistance value occurs and is provided to the write driver/sense amplifier 360. The write driver/sense amplifier 360 includes a plurality of sense amplification circuits for sensing and amplifying the data voltage and outputting a data signal of a digital level based on the data voltage. The data signal processed by the write driver/sense amplifier 360 is transmitted to the data input/output buffer 380 via the input/output driver 370. The data input/output unit 380 outputs the received data to the controller 200. The command decoder 310 may also be referred to as control logic, and one or more of the command decoder 310, the address buffer 320, the row decoder 330, the column decoder 340, the write driver/sense amplifier 360, the input/output driver 370 and the buffer 380 may be collectively referred to as an access circuit.

Figure 5A:
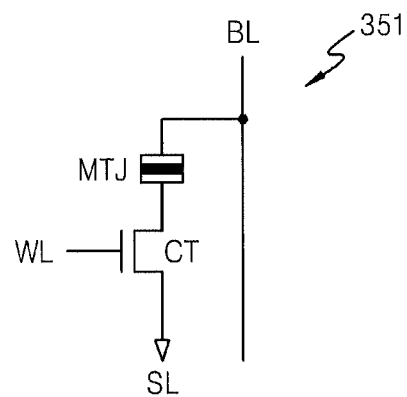
FIGS. 5A and 5B schematically illustrate an example of an MRAM cell.
Figure 5B:
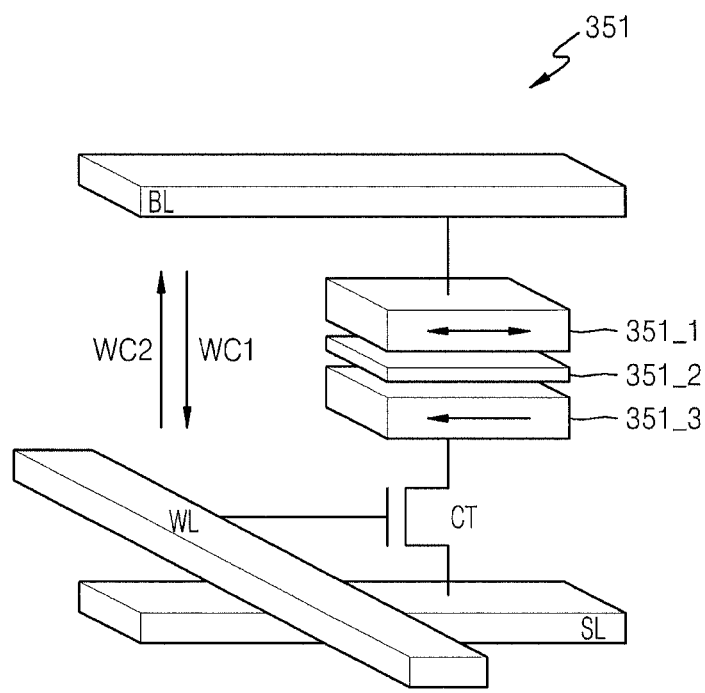

FIGS. 5A and 5B schematically illustrate an example of the MRAM cell 351. As an example, the MRAM cell 351 of FIGS. 5A and 5B is embodied by an STT-MRAM cell. As illustrated in FIG. 5A, each STT-MRAM cell includes a cell transistor CT and a magnetic tunnel junction (MTJ) device. A gate of the cell transistor CT is connected to the word line WL. One electrode of the cell transistor CT is connected to the bit line BL via the MTJ device. Also, the other electrode of the cell transistor CT is connected to a source line SL. The MRAM cells 351 included in the cell array 350 may be commonly connected to the source line SL. Alternatively, some cells and other cells of the MRAM cells 351 may be connected to different source lines SL.

Referring to FIG. 5B, the MTJ device may include a pinned layer 351_3, a free layer 351_1, and a tunnel layer 351_2 disposed therebetween. A magnetization direction of the pinned layer 351_3 is fixed. A magnetization direction of the free layer 351_1 may be the same as or opposite to the magnetization direction of the pinned layer 351_3 according to a condition. To fix the magnetization direction of the pinned layer 351_3, for example, an anti-ferromagnetic layer (not shown) may be further provided in the MTJ device.

To write data to the MRAM cell 351, a voltage of logic high is applied to the word line WL to turn the cell transistor CT on and write currents WC1 and WC2 are applied between the bit line BL and the source line SL. On the other hand, to read out data from the MRAM cell 351, a voltage of logic high is applied to the word line WL to turn the cell transistor on and a read current is applied in a direction from the bit line BL to the source line SL to determine data stored in the MRAM cell 351 according to a measured resistance value.

Figure 6A:
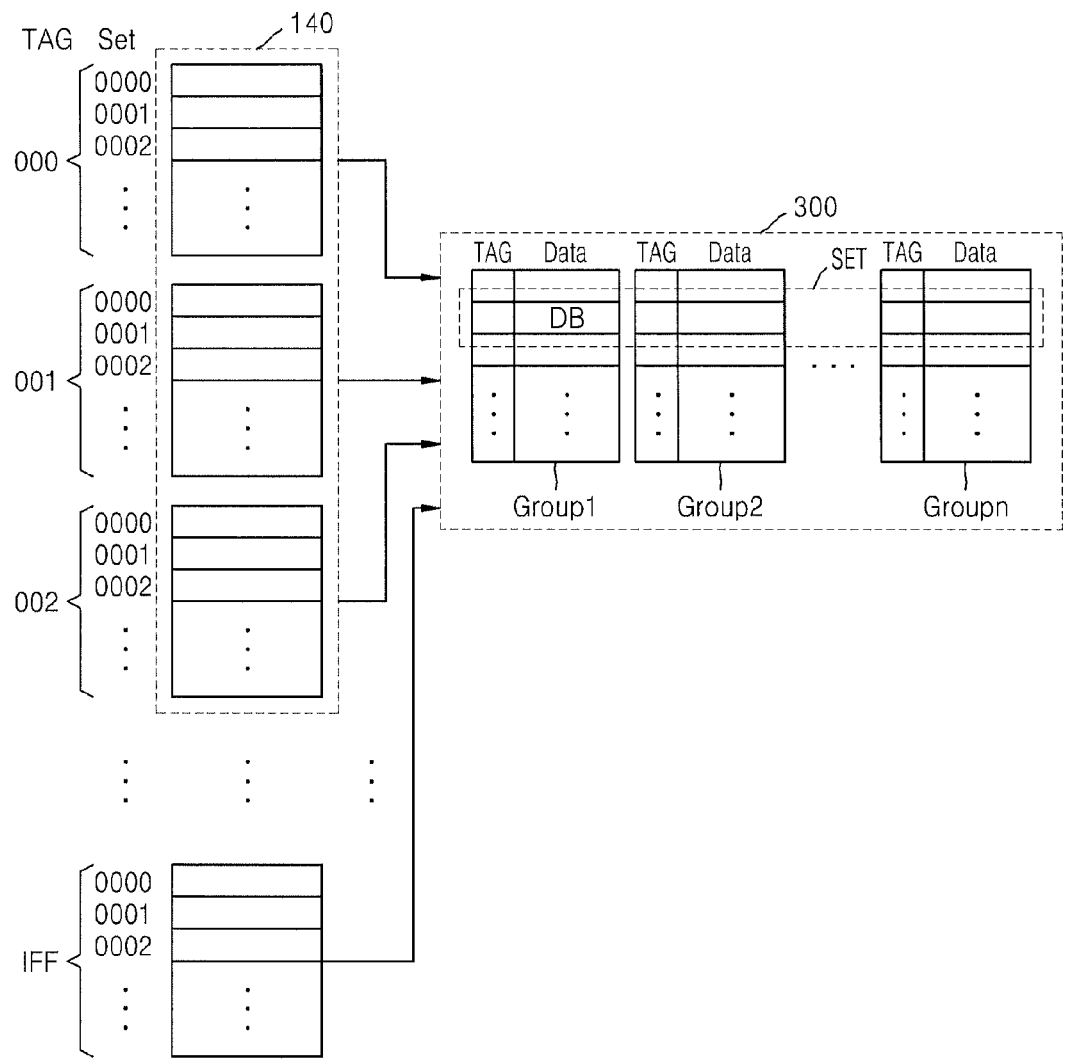
FIGS. 6A and 6B are block diagrams schematically illustrating an example of a mapping operation between the main memory and the cache memory of FIG. 1.
Figure 6B:
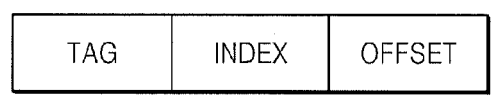

FIGS. 6A and 6B are block diagrams schematically illustrating an example of a mapping operation between the main memory 140 and the cache memory 110 of FIG. 1. In FIG. 6A, set-associative mapping is illustrated as an example of a mapping operation. Also, the cache memory 110 includes the MRAM device 300. FIG. 6A illustrates the cell array of the MRAM device 300.

The main memory 140 is divided into a plurality of sections having a certain size and a tag value is assigned to each divided section. For example, a tag value of a first section corresponds to "000" and a tag value of a second section corresponds to "001". A tag value of the last section may be "1FF".

The cell array of the MRAM device 300 included in the cache memory 110 may include a data region for storing data and the data region may include a plurality of groups. For example, the cell array of the MRAM device 300 includes n-number of groups Group 1-Group n for storing data. A size of a space for storing data of each group of the MRAM device 300 may be the same as that of each region of the main memory 140. For example, when the main memory 140 is divided into a plurality of sections, each section having a size of 32 Kbyte, a space for storing data in each group of the cell array of the MRAM 300 may have a size of 32 Kbyte.

Also, a space for storing data in one line in each group of the MRAM device 300 may be defined as a data block. When the cell array of the MRAM device 300 includes n-number of groups Group 1-Group n, one set may include n-number of data blocks. The cache memory 110 having the above structure may be referred to as an n-way set-associative cache.

When data of the main memory 140 is copied to the MRAM device 300, the data and a tag value of the data may be written to the cell array of the MRAM device 300. Then, when the data stored in the MRAM device 300 is read out, any one of a plurality of sets is selected according to index information to select a set SET. One block data may be selected based on an operation of comparing tag values with respect to a plurality of block data included in one set.

On the other hand, FIG. 6B illustrates an address structure to access the MRAM device 300 of FIG. 6A. As illustrated in FIG. 6B, an address may include a tag field, an index field, and an offset field. Any one of the sets may be selected by using a value of the index field. Any one of the data blocks may be selected by using a value of the tag field. Also, access to one block of data in units of bytes is possible by using a value of the offset field.

Although FIGS. 6A and 6B illustrate an example of writing the block data and the tag value together in one set, this is for convenience of explanation and the present inventive concepts are not limited thereto. For example, the MRAM device 300 may include a first cell array for storing data and a second cell array for storing a tag value. Then, a comparison operation is performed by reading out the tag value from the first cell array. An operation of selecting one or more block data of a plurality of block data from the second cell array according to a result of the comparison of tag values may be performed. Also, while not illustrated in FIGS. 6A and 6B, the MRAM device 300 may further include an additional cell array that includes a plurality of ECC blocks for storing ECC parities corresponding to the block data.

Figure 7:
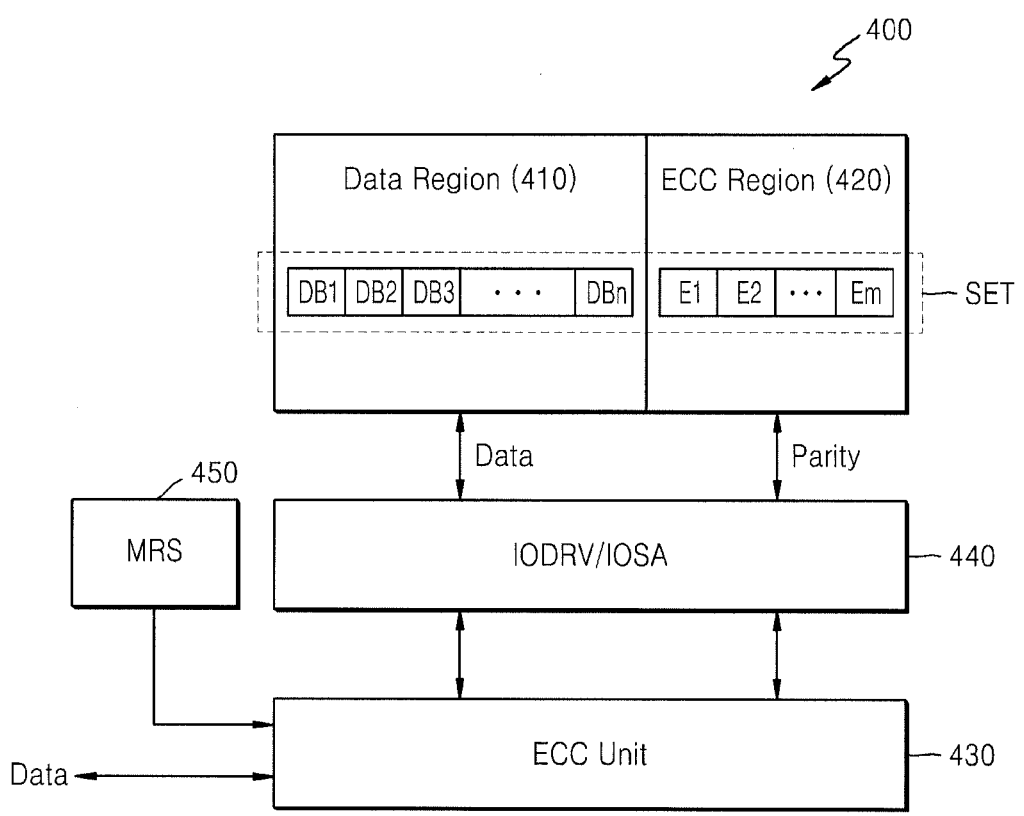
FIG. 7 is a block diagram schematically illustrating an example of an ECC operation of the MRAM.

FIG. 7 is a block diagram schematically illustrating an example of an ECC operation of an MRAM device 400. Referring to FIG. 7, the MRAM device 400 may include a cell array 410 and 420, an ECC unit 430, an input/output driver unit 440, and a mode register set (MRS) 450. The cell array 410 and 420 includes a first region for storing block data, for example, a data region 410, and a second region for storing ECC parity, for example, an ECC region 420.

According to the example embodiment of FIG. 7, two or more data blocks in the data region 410 and one or more ECC block in the ECC region 420 may be defined as the same set. For example, one set may include n-number of data blocks DB1-DBn and m-number of ECC blocks E1-Em. In other words, an ECC block is not arranged to respectively correspond to each of the data blocks DB1-DBn on a one-to-one basis, but m-number of ECC blocks E1-Em are shared by the n-numbered data blocks DB1-DBn, where m is less than n. Although not illustrated, data blocks and ECC blocks corresponding to a plurality of sets may be included in the cell arrays 410 and 420 of FIG. 7.

During the data write operation of the MRAM device 400, block data is written to the data region 410 and read out again to perform a verify operation, thereby detecting the number of error bits. The above series of operations may be defined as a write-read-verify operation. For example, the number of error bits may be detected in units of block data and whether an error bit occurs in the block data and whether the error bit may be corrected may be determined according to a result of the detection. As a result of the detection, when it is detected that an uncorrectable error occurs, the write-read-verify operation is performed again so that a rewrite operation is performed and then a verify operation is performed. Even when an uncorrectable error occurs by the initial write operation, all bits of the data may be written without any error by performing the write-read-verify operation again.

In other words, when all bits of data are written without any error through the initial write-read-verify operation or an additional write-read-verify operation thereafter, there is no need to store ECC parity corresponding to the data block. For the MRAM device 400, unlike an SRAM, there is a possibility of a data error occurring during a write operation and an ECC operation may not be needed for normally written data. Accordingly, since ECC parity corresponding to the block data that is written without any error in all bits is not written, the number of ECC blocks E1-Em that is less than the number of data blocks DB1-DBn may be arranged.

On the other hand, when only a correctable error occurs through the write-read-verify operation with respect to the MRAM device 400, the write operation may be completed without performing an additional write-read-verify operation. In other words, for a block data where only a correctable error occurs, an additional write-read-verify operation is not performed and ECC parity corresponding to the block data is written to an ECC block and thus the write operation may be completed. When the block data is read out, an error bit existing in the block data is corrected by the ECC parity. Accordingly, since the frequency of the write-read-verify operation may be reduced in writing the block data, a time used for the write operation may be reduced.

Each of the data blocks DB1-DBn may store block data and each of the ECC blocks E1-Em may store ECC parity. As described above, a tag value may be further stored in the MRAM device 400 to select a data block. The tag value may be written to a separate cell array (not shown) or written corresponding to each of the data blocks DB1-DBn. When the tag value is stored corresponding to each of the data blocks DB1-DBn, an additional storage space for storing a tag value may be included in each of the data blocks DB1-DBn.

Also, each of the ECC blocks E1-Em may store, in addition to the ECC parity value, information indicating whether an ECC block is effective or valid, for example, information indicating whether ECC parity used for ECC correction is stored, and position information, i.e., information indicating a corresponding data block of the n-number of data blocks DB1-DBn. The information indicating the effectiveness may be referred to as valid field information and the position information may be referred to as way field information. The valid field information and/or the way field information may be written to a separate cell array (not shown) or written corresponding to each of the ECC blocks E1-Em. When the valid field information and/or the way field information is stored corresponding to each of the ECC blocks E1-Em, an additional storage space for storing the information may be included in each of the ECC blocks E1-Em.

In the above-described example embodiment, although an example of first writing block data and then writing ECC parity according to a result of error detection was provided, the present inventive concepts are not limited thereto. For example, ECC parity is generated corresponding to block data and the block data and the ECC parity may be written to the data region 410 and the ECC region 420, respectively. During the read operation for detecting an error, the block data and the ECC parity are read out and an error bit detection operation may be performed on the read block data. As a result of the detection, when an error bit does not occur in the block data, valid field information indicating that a corresponding ECC block is invalid may be written. Alternatively, as another embodiment, during the detection of an error bit, an error bit that occurs in the block data and the ECC parity may be detected.

The write-read-verify operation may be performed based on the operations such as generation of ECC parity and detection of an error bit by the ECC unit 430. According to the an example embodiment, the operation of the ECC unit 430 varies according to m-number of ECC blocks, which are provided corresponding to n-number of data blocks according may be set by a control code, for example, an MRS code, from the MRS 450.

Figure 8:
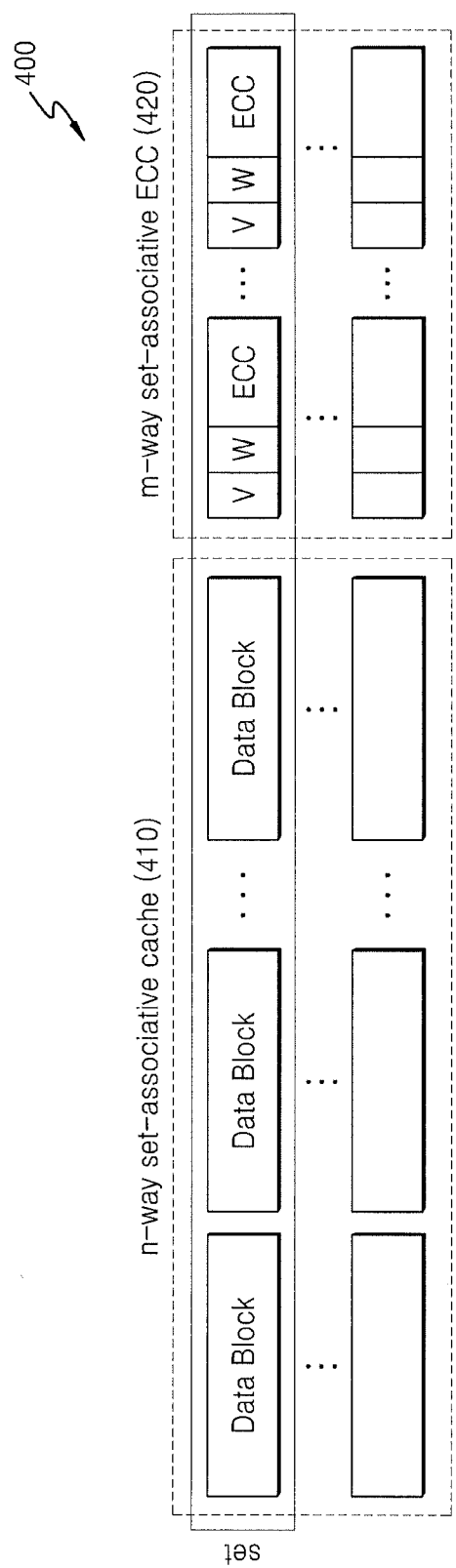
FIG. 8 is a block diagram schematically illustrating example structures of the data region and the ECC region of FIG. 7.

FIG. 8 is a block diagram schematically illustrating an example of structures of the data region 410 and the ECC region 420 of FIG. 7. Referring to FIG. 8, the data region 410 may have a structure corresponding to an n-way set-associative cache, whereas the ECC region 420 may have a structure corresponding to an m-way set-associative ECC. Also, each of the data region 410 and the ECC region 420 may include a plurality of sets and n-number of data blocks and m-number of ECC blocks may be selected by selecting any one set.

The data region 410 and the ECC region 420 may have the same number of sets, or the ECC region 420 may have a fewer number of sets than the data region 410. When different numbers of sets are provided, ECC parities of data blocks included in two or more sets of the data region 410 may be stored by ECC blocks included in one set of the ECC region 420.

Also, each of the ECC blocks of the ECC region 420 may include a first field ECC for storing ECC parity, a second field v for storing validation information, and a third field w for storing way information. When a first ECC block in any one of the sets stores ECC parity of the a-th data block, the ECC parity may be stored in the first field ECC of the first ECC block, information indicating that the ECC block is valid may be stored in the second field v, and information indicating the location of the a-th data block, for example, way information, may be stored in the third field w. In contrast, when the first ECC block is not valid, or the ECC parity is not stored, information indicating that the ECC block is invalid may be stored in the second field v. The way information is used to select any one of the data blocks belonging to one set. The same information as the tag value of the corresponding data block may be stored as way information.

FIG. 8 illustrates an example where valid field information and way field information in addition to the ECC parity are further written in each ECC block. However, the valid field information and the way field information may be stored in a separate cell array (not shown).

Figure 9:
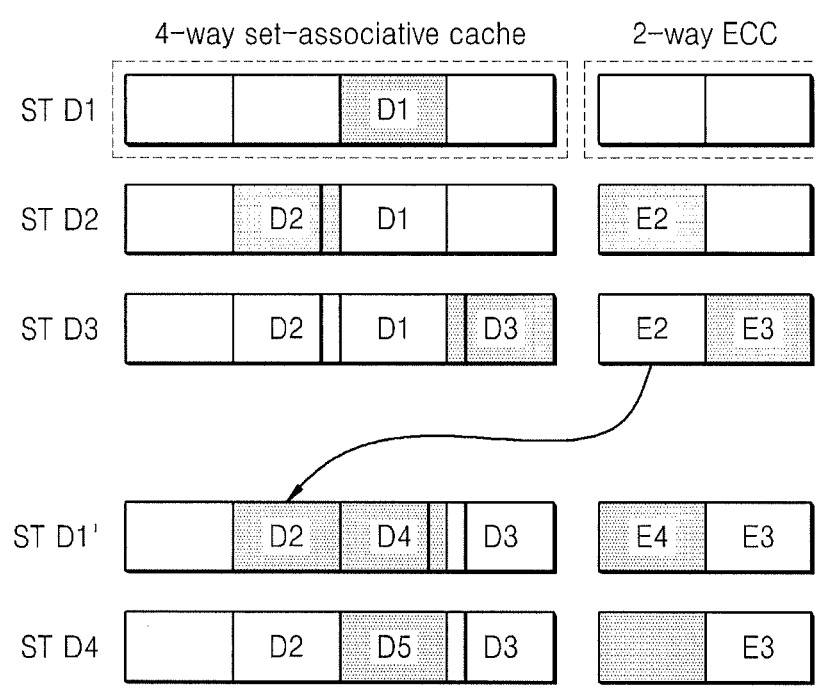
FIG. 9 is a block diagram schematically illustrating an example of information stored in the data region and the ECC region.
Figure 10:
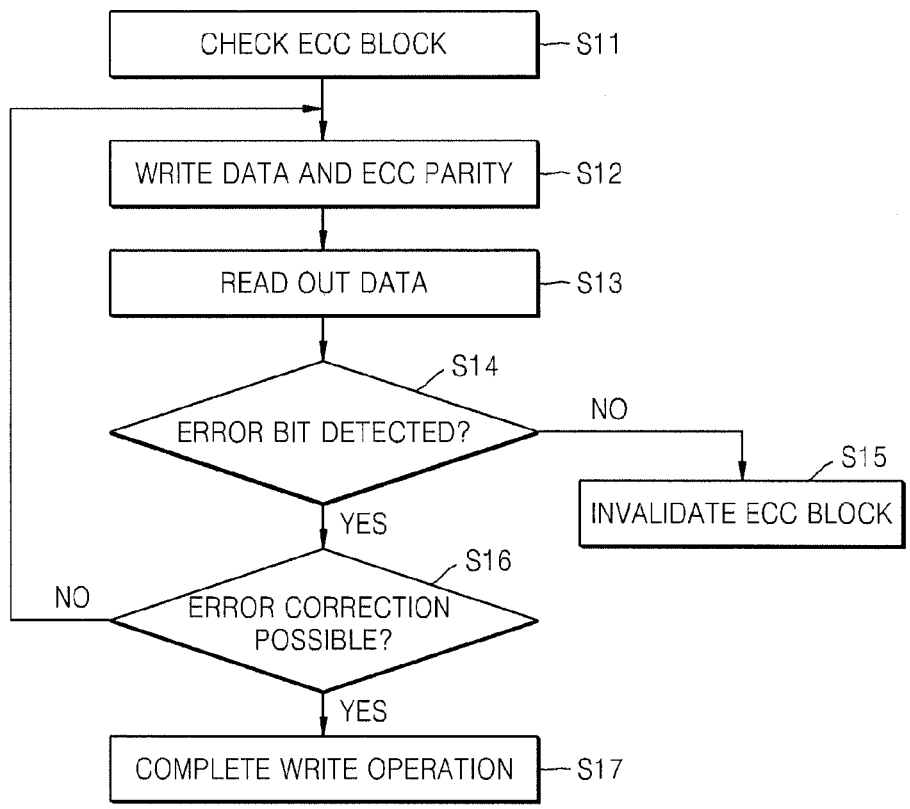
FIG. 10 is a flowchart for explaining a method of operating a semiconductor memory device according to an example embodiment of the present inventive concepts.

Examples of storing the block data and the ECC parity are described below with reference to FIGS. 9 and 10. FIG. 9 is a block diagram schematically illustrating an example of information stored in the data region 410 and the ECC region 420. FIG. 10 is a flowchart for explaining a method of operating a semiconductor memory device, or a cache memory, according to an example embodiment of the present inventive concepts.

Because the data block and the ECC block do not correspond one-to-one to each other, an access design appropriate thereto is provided. When there is a request to write data to the data region 410, the information in the second field v of the ECC blocks of the ECC region 420 is checked to determine whether a currently invalid ECC block exists. When an invalid (or usable) ECC block is obtained, the block data that is requested to be written and ECC parity corresponding thereto are respectively written to the data block and the available ECC block (i.e., an invalid block). Then, the written data, or the data and the ECC parity, are read out and a verify operation to detect the number of error bits is performed. If correctable errors are present, the ECC block is changed to valid. If no errors are present, the ECC block remains invalid. If uncorrectable errors are present, the operations of write-read-verify are repeated.

In the example of FIG. 9, four (4) data blocks are provided with respect to one set of the data region 410, whereas two (2) ECC blocks are arranged with respect to one set of the ECC region 420. Also, an example of detecting an error bit occurring in the block data through the write-read-verify operation on the block data will be described.

First, first block data D1 is stored in a data block, e.g., a third data block, of the data region 410. Then, a read-verify operation is performed on the first block data D1. When all bits of the first block data D1 are written without error, the write operation on the first block data D1 is completed without storing of ECC parity for the ECC block or without indicating a valid ECC block for first block data D1.

Then, second and third block data D2 and D3 are written to the data region 410 and a read-verify operation is performed thereon. Assume an uncorrectable error occurs in the second and third block data D2 and D3, and a rewrite and read-verify operation is repeatedly performed on the block data where an error occurs. Assume that subsequently only a correctable error occurs in the second and third block data D2 and D3, and second and third ECC parities E2 and E3 are respectively written to the first and second ECC blocks. Information indicating that the first and second ECC blocks are valid is written to the valid fields. Way information about the data blocks corresponding to each of the first and second ECC blocks, respectively, is also written.

Next, assume a fourth block data D4 is to be written at a position where the first block data D1 is currently written. In this case, since both of the first and second ECC blocks are valid, an invalidation operation is performed on any one of the ECC blocks.

The invalidation operation may be performed by selecting any one of the data blocks and the corresponding ECC block and repeating a write-read-verify operation for the selected data block. For example, any one of the ECC blocks is selected, for example the second ECC block is selected. A write operation is performed again on the second block data D2 and a second ECC parity E2. The second block data D2 that is rewritten is read out and thus it is detected whether an error bit exists. Assume no error bit exists in the second block data D2 after the write-read-verify operation is performed again. Accordingly, the first ECC block corresponding to the second block data D2 is invalidated.

The fourth block data D4 is written to the third data block location. A read-verify operation is performed on the fourth block data D4 that is written. Assume only a correctable error occurs in the fourth block data D4. Accordingly, a fourth ECC parity E4 corresponding to the fourth block data D4 is written to the first ECC block. Also, information indicating that the ECC block is valid and way information indicating the location of the fourth block data D4 may be further written to the first ECC block. In contrast, if no error bit occurs in the fourth block data D4, the first ECC block may be maintained in an invalid state.

The invalidation operation may be performed based on a cache operation. For example, when the fourth block data D4 is evicted from the cache region 410 due to cache miss, the first ECC block where ECC parity corresponding to the fourth block data D4 is stored may be invalidated. Then, fifth block data D5 may be written to the third data block as another data. When no error bit occurs in the fifth block data D5 as a result of a read-verify operation, the invalidation of the first ECC block may be maintained.

According to the above-described example embodiment, the write-read-verify operation is performed on the block data and each of the ECC blocks may be in an initially invalid state. After writing block data, a verify operation is performed on the data obtained through a read operation. When no error bit is detected during the verify operation, a write operation on the data is terminated. In contrast, when a correctable error in the block data is detected during the verify operation, ECC parity corresponding to the block data is determined and written to the ECC region. Information indicating that the ECC block is valid and way information indicating the location of the data block corresponding to the ECC block are further written to the ECC region.

The above-described ECC parity write operation may be diversely changed in design within a range of the technical concepts of the present inventive concepts. For example, during the operation of writing the first block data, ECC parity corresponding thereto may be written together to the first ECC block. Also, the number of error bits may be detected by reading out all of the block data and the ECC parities. When an error occurs only in the first ECC parity corresponding to the first block data D1, since no error bit exists in the first block data D1 that is actually requested to be accessed, there is no need to perform an error correction operation on the first block data D1. Accordingly, the first ECC block may be invalidated.

In the example of FIG. 9, when all ECC blocks are in a valid state and then a write request of the fourth block data D4 is received, the fourth block data D4 may be written to an appropriate region, for example, the third data block in FIG. 9, without invalidating any one of the ECC blocks through a rewrite-read-verify operation. Then, when it is determined that no error bit occurs after the read-verify operation with respect to the fourth block data D4, the operation of writing the fourth block data D4 is terminated. In contrast, when a correctable error occurs in the fourth block data D4, as described above, any one of the ECC blocks, for example, the first ECC block, is invalidated and the fourth ECC parity corresponding to the fourth block data D4 may be written to the first ECC block.

As another example embodiment, assume there is a request to write another data, for example, the fourth data block, where the third block data D3 is stored after all ECC blocks are in a valid state. In this case, since the third block data D3 is evicted from the data region, the second ECC block corresponding thereto may be invalidated. In other words, with no need to invalidate any one of the ECC blocks through an additional write-read-verify operation to prevent occurrence of an error bit, a usable ECC block may be obtained by invalidating an ECC block corresponding to the evicted data block.

As illustrated in FIG. 10, in the method of operating the cache memory according to an example embodiment, an ECC block to store ECC parity is checked as writing block data is requested (S11). Checking an ECC block may include the operations of checking whether a usable ECC block exists by searching for validation information about each ECC block and selecting an ECC block to be used. When all ECC blocks are valid as an invalidation operation is performed so that one or more ECC blocks may be made usable.

Block data and ECC parity are respectively written in the data region and the ECC region of the MRAM (S12). Then, the written block data is read out (S13) and an operation of detecting an error bit from the read block data is performed (S14). The detection operation may include an operation of detecting the number of error bits. When an error bit is not detected, the ECC block where the ECC parity is written is invalidated (S15). Otherwise, i.e., when an error bit is detected, it is determined whether the error bit is correctable (S16). When error correction is possible, the operation of writing the block data is completed (S17). In this case, the ECC block where the ECC parity corresponding to the block data is written is maintained in a valid state. Information indicating that the ECC block is valid and way information indicating the position where the block data corresponding to the written ECC parity is written are included in the validated ECC block.

In contrast, when an uncorrectable error occurs in the block data, an operation of rewriting the block data and the ECC parity is performed and a read-verify operation is performed again after the rewrite operation. When an error bit does not occur in the block data as a result of the rewrite, an operation of invalidating the corresponding ECC block is performed. When only a correctable error occurs, the write operation is completed while the ECC block is maintained valid.

Although an example of generating and writing ECC parity during the operation of writing block data is described in the example embodiment of FIG. 10, as described above, the ECC parity may be written after the operation of detecting an error bit. In this case, only the operation of writing block data may be performed in S12 and an operation of writing ECC parity, validation information, and way information may be further performed before the write operation is completed (e.g., after the S16 but before step S17).

Also, regarding the detection of an error bit, it may be detected whether an error bit occurs in the read block data and ECC parity. When no error bit occurs in the block data, even when an error bit occurs in the ECC parity, the corresponding ECC block may be invalidated. Also, whether to correct an error may be determined by counting the number of error bits and the number of error bits may be the number of error bits occurring in the block data and the ECC parity.

Figure 11:
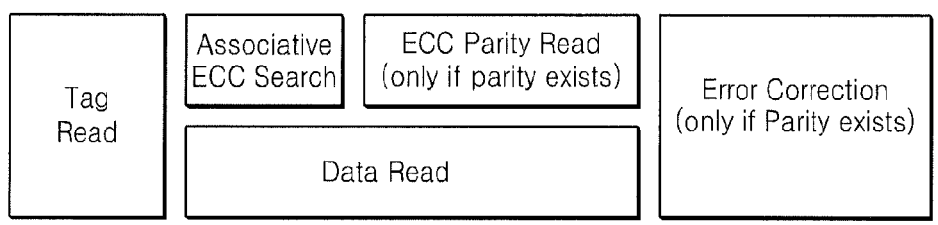
FIG. 11 is a block diagram schematically illustrating a data read operation of a cache memory according to an example embodiment of the present inventive concepts.

FIG. 11 is a block diagram schematically illustrating a data read operation of the cache memory 110 according to an example embodiment of the present inventive concepts. Here the cache memory 110 may include a tag value indicating the position in the main memory 140 where the block data is stored, in addition to the data, for example, block data, to be actually used by the CPU 150. When the block data is accessed, the tag value stored in a separate cell array is read out first. Then, one or more block data included in any one of the sets is read out. One of a plurality of block data belonging to one set may be selected by the read tag value.

Assuming that the tag value and the block data are sequentially read out, an operation of reading the block data and an associated ECC parity may be simultaneously performed. In other words, cache hit/miss may be determined in performing operations of reading and comparing a tag value. For cache hit, the tag value is compared with way field information about the ECC block and thus an ECC block having way information matching the tag value may be searched. The tag value compared with the way field information about the ECC block may be information included in an external address. When ECC parity is read out from the searched ECC block, an error correction operation may be performed by using the selected block data and ECC parity.

Although in the embodiment of FIG. 11 a tag value is stored in a separate cell array, an additional space for storing a tag value may be provided in each data block in other example embodiments. In this case, the tag value and the block data may be substantially simultaneously read out. Also, although the ECC parity and the way information are described to be stored together in the ECC block, the validation information and/or way information related to the ECC parity may be stored in a separate cell array.

According to the above-described example embodiment, since the reading of the block data and ECC parity may be substantially simultaneously performed, a problem that read latency increases may be reduced. Also, since the ECC block has a value or a size smaller than the data block, the operation of searching the related ECC block and reading the ECC parity may be sufficiently completed in the middle of the operation of reading the block data. Also, when the ECC block corresponding to the block data is not searched, external output is possible without error correction on the block data and thus time for error correction may be reduced.

Figure 12:
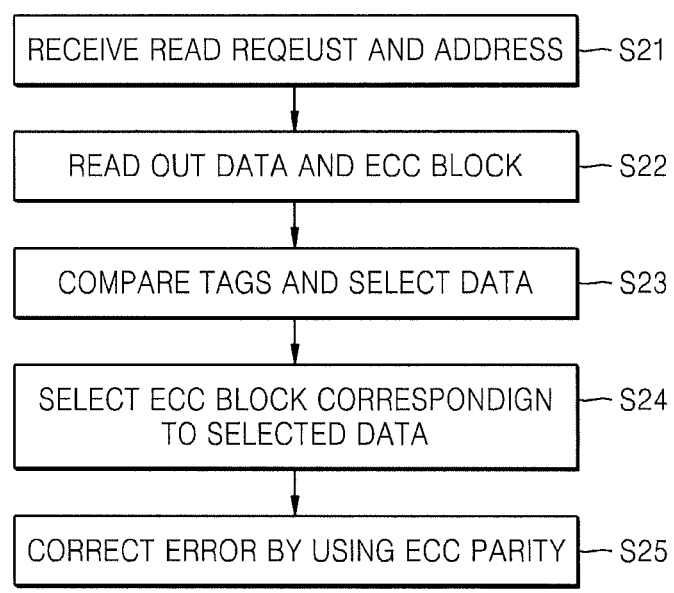
FIG. 12 a flowchart for explaining a method of operating a semiconductor memory device according to another example embodiment of the present inventive concepts.

FIG. 12 a flowchart for explaining a method of operating a semiconductor memory device or a cache memory, for example, during a data read operation, according to another example embodiment of the present inventive concepts. In FIG. 12 it is assumed the data being read exists in the cache memory.

Referring to FIG. 12, a read request is received from the CPU 150 and simultaneously an address indicating access requested data is received (S21). Block data written to any one set are read out according to index information included in the address and the information stored in the ECC blocks are read out (S22). For selection of block data, a tag value included in an external address and a tag value corresponding to each data block are compared with each other and thus the requested data (e.g. matching tag) is selected (S23). Also, of valid ECC blocks of the ECC blocks, an ECC block having way information matching the tag value included in the address is selected (S24). An error correction operation is performed by using the main data of the selected block data and the ECC parity of the ECC block (S25).

According to the write-read operation with respect to ECC parity according to the example embodiment, the area taken by the ECC block is reduced and also an error in the block data written in a cache region may be effectively corrected. Also, in a data read operation, since the error correction operation is performed only when a valid ECC block exists corresponding to the access requested block data, read latency when no error exists may be reduced. Also, power needed for error correction may be reduced.

Figure 13:
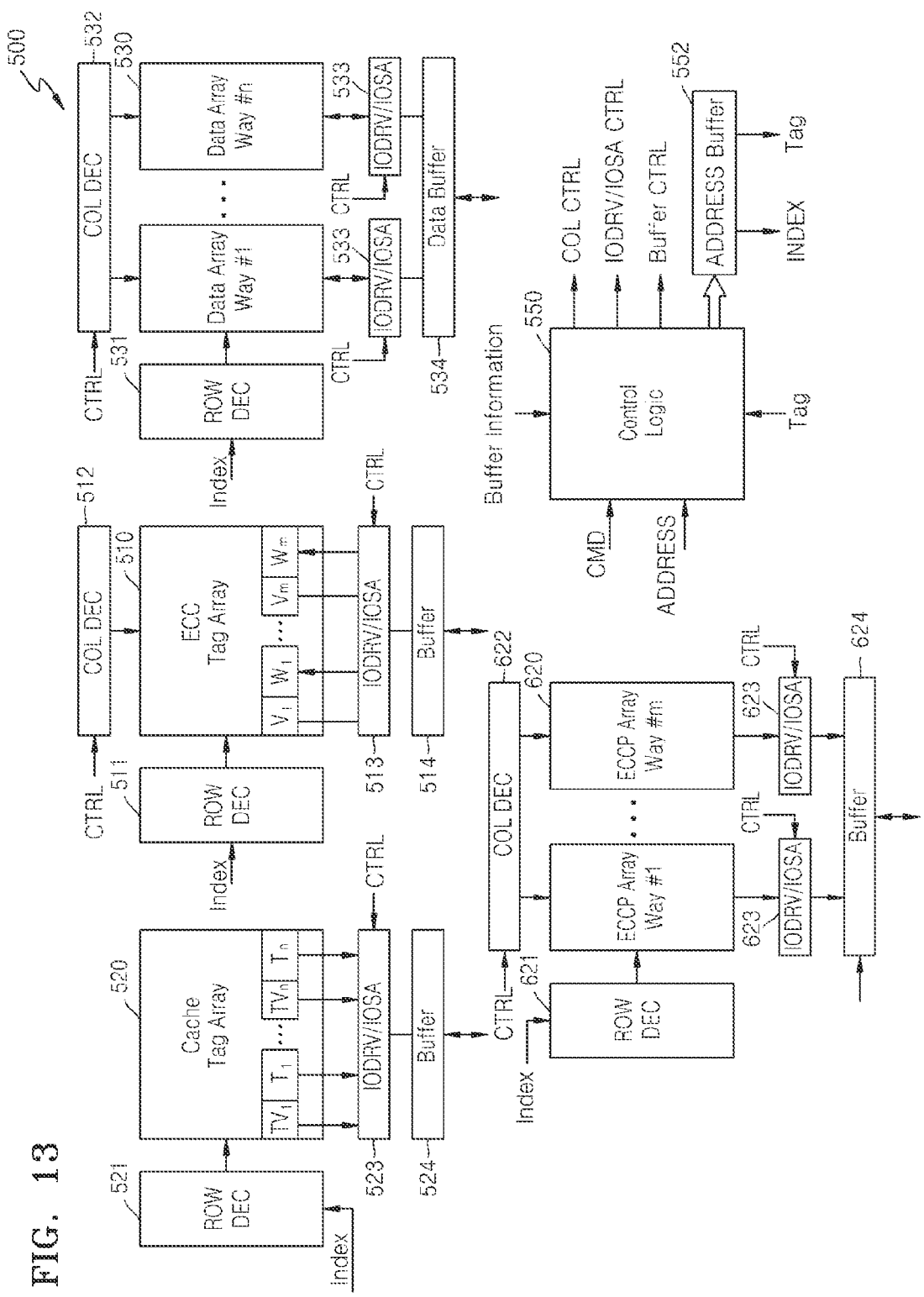
FIG. 13 is a block diagram schematically illustrating an example of an MRAM device for an operation as cache memory according to another example embodiment of the present inventive concepts.

FIG. 13 illustrates another example embodiment of a MRAM device. As shown, the MRAM device includes a cache tag array 520, an ECC tag array 510, first through nth data arrays 530 first through mth ECC parity (ECCP) arrays 620, control logic 550, and an address buffer 552. A row decoder 521, input/output driver and sense amplifier (IODRV/IOSA) circuit 523 and a buffer 524 are associated with the cache tag array 520. A row decoder 511, a column decoder 512, a IODRV/IOSA circuit 513 and a buffer 514 are associated with the ECC tag array 510. A row decoder 531, column decoder 532, first through nth IODRV/IOSA circuit 533 and a buffer 534 are associated with the first through nth data arrays 530. A row decoder 621, column decoder 622, first through mth IODRV/IOSA circuits 623 and a buffer 624 are associated with the first through mth ECCP arrays 620.

The control logic 550 receives a command CMD and associated address information ADDRESS as well as information stored in one or more of the buffers 514, 524, 534 and 624. Based on these inputs, the control logic 550 generates control signals Col CTRL, IODRV/IOSA CTRL and Buffer CTRL to control operation of the column decoders 512, 532, 622, the IODRV/IOSA circuits 513, 523, 533 and 623, and the buffers 514, 524, 534, 624 and 552. The operation of the control logic 550 will be described in greater detail below. The control logic 550 also decodes the received address into at least the tag and index (as described above), and stores the tag and index in an address buffer 552.

Next, the operation of the control logic 550 will be described in greater detail with respect to an example write operation and an example read operation of the MRAM device 500.

During an example write operation, the control logic 550 receives a write command as the command CMD, and receives the address ADDRESS to be written. The data block to be written is received and stored in the buffer 534 and any associated ECC block is stored in the buffer 624.

The control logic 550 decodes the address ADDRESS into a received tag and a received index, and stores the received tag and index in the address buffer 552. The index is supplied to the row decoder 521. The row decoder 521 accesses the row of tag and associated tag validity information indicated by the index. The stored tag and tag validity information are sensed and stored in the buffer 524 by the IODRV/IOSA circuit 523.

The tag information includes a tag value corresponding to the data arrays 530. The associated validity values TV1-TVn indicates whether the respective tag value T1-Tn is valid. The control logic 550 may compare each of the stored tag values T1-Tn to the received tag from the address buffer 552. Based on the comparisons, the control logic 550 knows whether the received tag matches a stored tag; and based on the validity values, the control logic 550 knows whether a matching stored tag is valid.

Based on these determinations, the control logic 550 controls the storing of the data block in the appropriate one of the first to nth data arrays 530. For example, the control logic 550 controls the column decoder 532 to access the first to nth data array 530 corresponding to a valid one of the stored tag values that matches the received tag value. If the nth stored tag value matches the received tag value and the nth stored tag value is valid, then the control logic 550 controls the column decoder 532 to access the nth data array 530. The control logic 550 also controls the data buffer 534 and the IODRV/IOSA circuits 533 such that the received data block is stored in the determined one of the first to nth data arrays 530. The row decoder 531 receives the index, and accordingly, the data block is stored in the row indicated by the index.

During the writing of the data block, the control logic 550 also controls storage of the ECC block. Here, the row decoder 511 is also supplied with the index, and the control logic 550 controls the column decoder 512 and the IODRV/IOSA circuits 513 to read out the way information and associated validity information in the row accessed by the row decoder 511. The validity information includes validity values V1-Vm as described with respect to FIG. 8, and the way information includes way values W1-Wm as described with respect to FIG. 8. Accordingly, each validity value V indicates whether a corresponding way value W is valid, and each way value identifies the data block to which the ECC block associated with the way information corresponds. As will be appreciated from the this and the following description, the way value and the ECC block correspond based on their storage location in the respective ECC tag array 512 and the ECCP arrays 620.

By examining the validity information, the control logic 550 identifies an invalid way value. Assuming an invalid way value is identified, the control logic 550 stores way information for the written data block in the invalid way value location in the ECC tag array 510 and also changes the validity value therefore to indicate validity. Here, the control logic 550 supplies the way information to the buffer 514, and controls the column decoder 512 and the IODRV/IOSA circuit 513 to store the way information.

The control logic 550 also stores the ECC block in the buffer 624 in the first to mth ECCP array 620 corresponding to the location of the way information being stored. For example, if the way information is being stored as the Wmth way information, then the ECC block is stored in the mth ECCP array 620 and in the row accessed by the row decoder 621 based on the received index. It will be appreciated that the control logic 550 controls the column decoder 622 and the IODRV/IOSA circuits 623 to store the ECC block as described above, and that this storing operation may be performed concurrently with or overlapping in time with the storing of the way information.

In the above description it was assumed that an invalid way information location existed in the ECC tag array 510. However, if no invalid way information location exists, then the control logic 550 must perform an invalidation operation such as described in detail above with respect to FIG. 9, and as will be described in detail below with respect to FIG. 19.

Next an example read operation will be described with respect to FIG. 13. During an example read operation, the control logic 550 receives a read command as the command CMD, and receives the address ADDRESS to be read.

The control logic 550 decodes the address ADDRESS into a received tag and a received index, and stores the received tag and index in the address buffer 552. The index is supplied to the row decoder 521. The row decoder 521 accesses the row of tag and associated tag validity information indicated by the index. The stored tag and tag validity information are sensed and stored in the buffer 524 by the IODRV/IOSA circuit 523. The control logic 550 compares each of the stored tag values T1-Tn to the received tag from the address buffer 552. Based on the comparisons, the control logic 550 knows whether the received tag matches a stored tag; and based on the validity values, the control logic 550 knows whether a matching stored tag is valid. Based on the valid, matching tag, the control logic 550 determines the location of the data block in the first to nth data arrays 530. Namely, the control logic determines the way information for the data block being read.

Based on these determinations, the control logic 550 controls reading of the data block from the appropriate one of the first to nth data arrays 530. For example, the control logic 550 controls the column decoder 532 to access the first to nth data arrays 530 corresponding to a valid one of the stored tag values that matches the received tag value. And, the row decoder 531 accesses the appropriate row based on the index. For example, if the nth stored tag value matches the received tag value and the nth stored tag value is valid, then the control logic 550 controls the column decoder 532 to access the nth data array 530. The control logic 550 also controls the IODRV/IOSA circuits 533 to sense the read data block and store the read data block in the buffer 534.

The index is supplied to the row decoder 511. The row decoder 511 accesses the row of way and associated validity information indicated by the index. The control logic 550 controls the column decoder 512 to access the entire row of way and validity values. The accessed way and validity values are sensed and stored in the buffer 514 by the IODRV/IOSA circuit 513.

The control logic 550 compares each of the stored way values W1-Wm to the determined way information. Based on the comparisons, the control logic 550 knows whether the stored way information matches the determined way information; and based on the validity values, the control logic 550 knows whether matching stored way information is valid.

If valid, matching way information is detected, then during the reading of the data block, the control logic 550 also controls reading of a corresponding ECC block. Namely, the control logic 550 controls the column decoder 622 based on the detected valid way information, and the row decoder 621 operates based on the received index. The control logic 550 controls the IODRV/IOSA circuits 623 to sense the ECC block being read, and store the read ECC block in the buffer 624.

As will be appreciated, the control logic 550 may be one or more hardwired circuits and/or a special purpose machine in the form of a programmed processor (or controller. The control logic 550 may also perform any of the methods described herein. Furthermore, the control logic 550 along with any of the row decoders, the column decoders, the IODRV/IOSA circuits, and buffers may be collectively referred to as an access circuit.

It is also apparent that design of MRAM device discussed above may be partially changed while maintaining the function of the present inventive concepts.

Figure 14A:
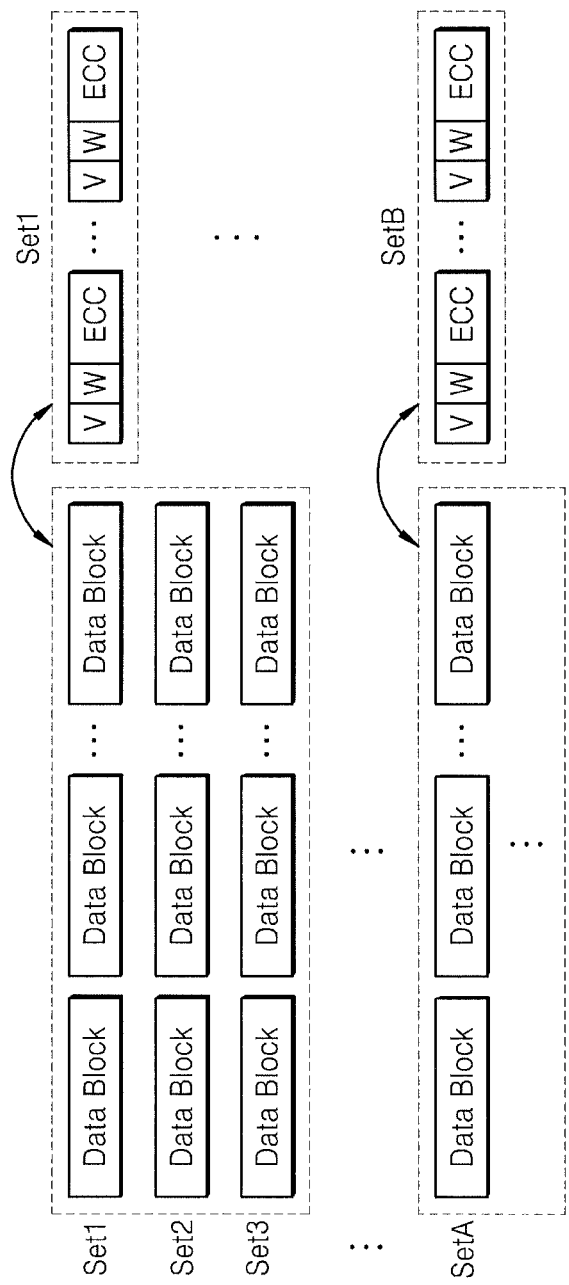
FIGS. 14A and 14B are block diagrams schematically illustrating an example of a cache memory according to another example embodiment of the present inventive concepts.
Figure 14B:
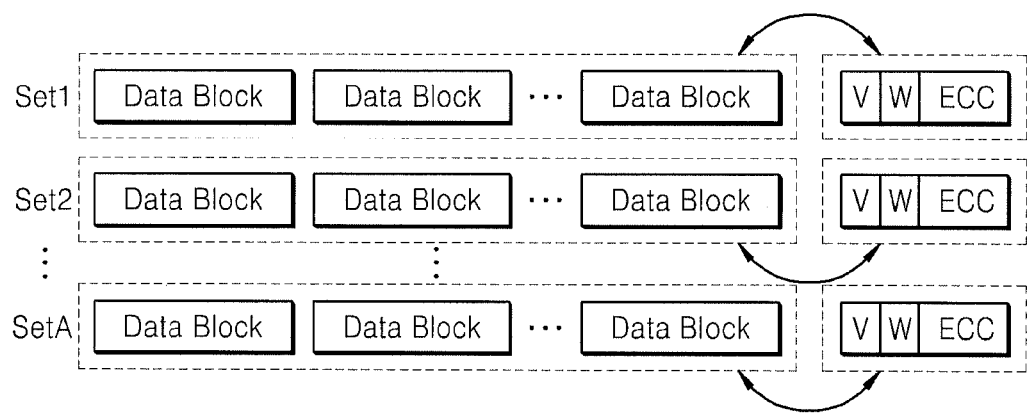

FIGS. 14A and 14B are block diagrams schematically illustrating an example of a cache memory according to another example embodiment of the present inventive concepts. FIG. 14A illustrates an example in which ECC blocks included in one set are shared by data blocks included in a plurality of sets. FIG. 14B illustrates an example in which one ECC block is provided corresponding to data blocks of one set. Although it is not illustrated in FIGS. 14A and 14B, each data block may further include a tag value in addition to main data. Also, a validation field and a way field of an ECC block may be stored in a separate cell array.

Referring to FIG. 14A, a cell array included in the MRAM device may include an area for storing block data (hereinafter, referred to as the data region) and an area for storing ECC parity (hereinafter, referred to as the ECC region). Each of the data region and the ECC region may have a set-associative structure. Accordingly, the data region may include a plurality of sets Set1-SetA and the ECC region may include a plurality of sets Set1-SetB. Each set in the data region includes a plurality of data blocks. Each set in the ECC region includes one or more ECC blocks.

Also, the number of sets Set1-SetB included in the ECC region is smaller than that of the sets Set1-SetA included in the data region. Accordingly, ECC blocks included in one set in the ECC region may be shared by data blocks included in at least two sets in the data region. FIG. 14A illustrates an example in which data blocks included in three sets in the ECC region share ECC blocks of one set in the ECC region.

In this case, additional information may be included in the ECC block. For example, in the above-described example embodiment a set in the ECC region one-to-one corresponds to a set in the data region and thus the set in the ECC region is selected together with the set in the data region according to information, for example, index information, for assigning a set. In contrast, in the example embodiment of FIG. 14A, the ECC block may further include a field for storing information about position of a set in which data block is included, in addition to the validation field, the way field, and the ECC field. For example, when ECC parity to correct an error in the block data is read out, information about the way field of the ECC block is compared with a tag value and thus a data block on which ECC correction is to be performed may be selected in one set. The position of a set to which the data block on which the ECC correction is to be performed belongs may be determined by comparing the set position information about the ECC block with index information.

Although in FIG. 14A an example in which a number of sets of data blocks, for example, three sets, corresponds to one set of ECC blocks, different number of sets of data blocks may correspond to each set of ECC blocks.

On the other hand, FIG. 14B illustrates an example in which one ECC block is arranged corresponding to one set in the data region. In the example of FIG. 14B, a plurality of data blocks and one ECC block are selected according to the same index information, but the present inventive concepts are not limited thereto. For example, a cell array including ECC blocks may be embodied by one set including a plurality of ECC blocks. In this case, as a structure similar to that of FIG. 14A, each set including ECC blocks may be shared by a plurality of sets including data blocks. In this case, as described above, information about the position of a set to which a block data on which ECC correction is to be performed belongs may be further stored in the ECC block.

FIGS. 15A, 15B, and 15C are block diagrams schematically illustrating an example of an MRAM device according to another example embodiment of the present inventive concepts. Although only an MRAM cell array is illustrated in FIGS. 15A, 15B, and 15C for convenience of explanation, peripheral circuits for data write/read operations on an MRAM cell array may be further provided in the MRAM device.

The MRAM device according to the present example embodiment may be applied not only to a cache memory but also to other memories in a computer system. For example, the MRAM device according to the example embodiment may be applied to the main memory 140 of FIG. 1 or to a storage unit for storing a large capacity of data although it is not illustrated in FIG. 1. In the example of FIGS. 15A, 15B, and 15C, it is assumed that the main memory of the computer system includes the MRAM device according to the example embodiment.

A cell array of the MRAM device may include a plurality of pages. Each of pages is selected by a different row address and MRAM cells included in each page are connected to the same word line. Also, the cell array may include a data region for storing main data and an ECC region for storing ECC parity for correcting an error bit occurring in the main data.

Referring to FIGS. 15A and 15B, one page may include a region for storing data and a region for storing ECC parity. For example, a first page Page 1 include a plurality of blocks as illustrated in FIG. 15B. The blocks includes data blocks DB1-DBn for storing data and ECC blocks E1-Em for storing ECC parity. As in the above-described example embodiment, the number of ECC blocks E1-Em included in the first page Page 1 is smaller than that of data blocks DB1-DBn.

A standard for classifying the sizes of data blocks DB1-DBn may be set in a variety of forms. For example, an ECC unit may be defined as a unit of error correction with respect to read data and each data block may have a size corresponding to the ECC unit. In other words, the first page Page 1 as the ECC unit includes a plurality of data blocks DB1-DBn. The ECC blocks E1-Em including ECC parity for error correction are included in the first page Page 1 corresponding to the data blocks DB1-DBn. As in the above-described example embodiment, the data blocks DB1-DBn have a structure of sharing the ECC blocks E1-Em.

FIG. 15C illustrates another example of storing data and ECC parity. Referring to FIG. 15C, a cell array includes a plurality of pages and an error in data belonging to at least two pages is corrected by an ECC block included in one page. For example, ECC parity may be stored in some pages of the cell array. FIG. 15A illustrates an example in which an ECC block stored in one page (Page 1) is shared by data blocks included in two or more pages.

In the example embodiments of FIGS. 15A, 15B, and 15C, information other than the ECC parity may be further stored in the ECC region. In other words, n-number of data blocks have a structure of sharing m-number of ECC blocks that is smaller than the n-number of data blocks. Accordingly, information about whether an ECC block is valid, and information about the position of a data block corresponding to the ECC block may be further stored in the ECC region.

Also, in the example embodiments of FIGS. 15A, 15B, and 15C, although an example in which the data block and the ECC block are included in one cell array is illustrated, as in the above-described example embodiment, a separate cell array including the ECC blocks may be further provided.

Figure 16A:
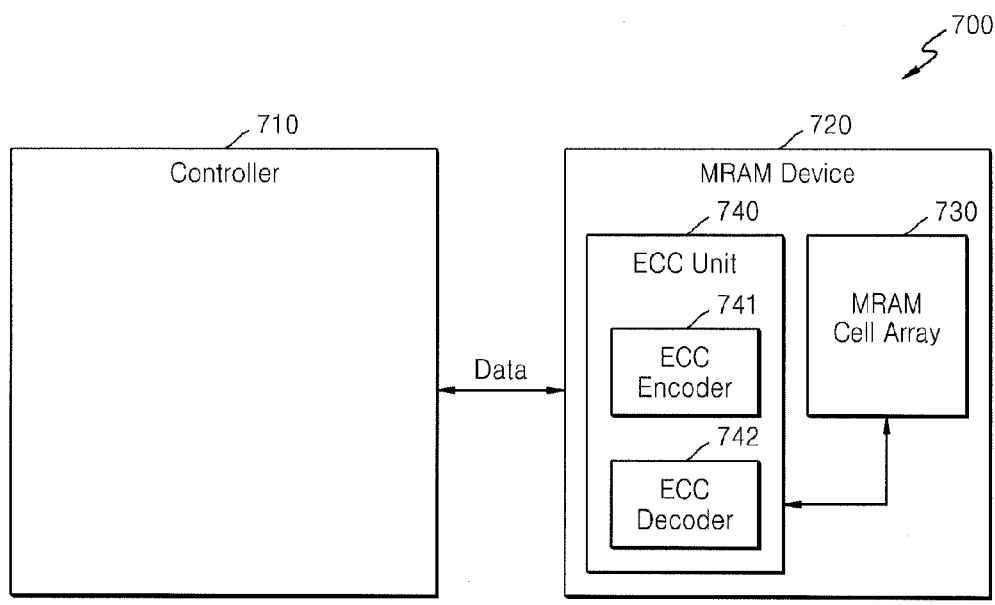
FIGS. 16A and 16B are block diagrams schematically illustrating an example of an MRAM system according to an example embodiment of the present inventive concepts.
Figure 16B:
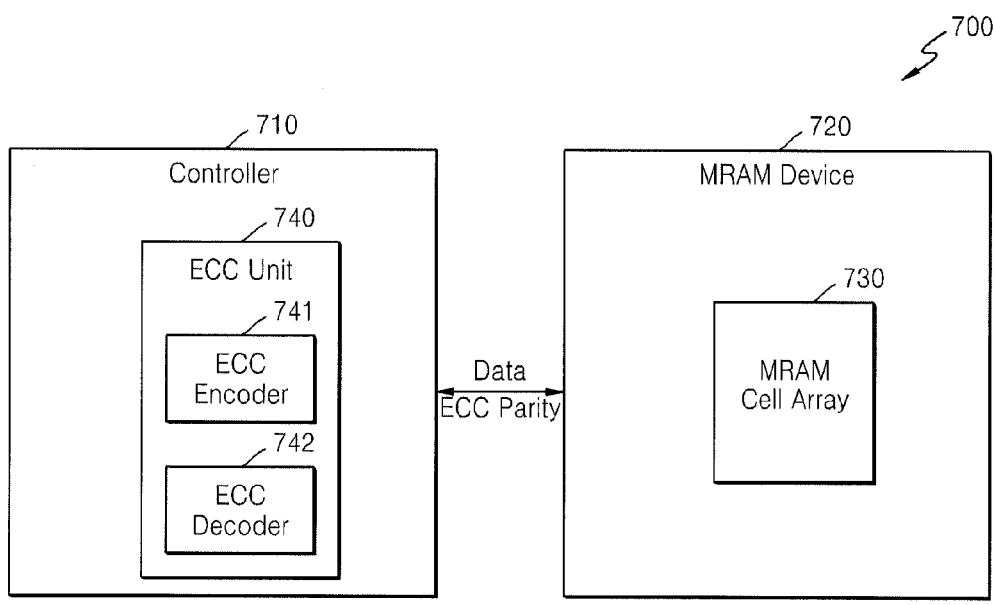

FIGS. 16A and 16B are block diagrams schematically illustrating an example of an MRAM system 700 according to an example embodiment of the present inventive concepts. Referring to FIGS. 16A and 16B, the MRAM system 700 may include a controller 710 for controlling a memory operation such as write and read and an MRAM device 720 including an MRAM cell array 730. Also, the MRAM system 700 further includes an ECC unit 740 for generating ECC parity for performing error detection and correction on data to be written to the MRAM cell array 730. The MRAM system 700 may be used for various storage units in the computer system. For example, at least one of the cache memory 110, the main memory 140, and a large capacity storage unit (not shown) of FIG. 1 may include the MRAM system 700.

FIG. 16A illustrates an example in which the ECC unit 740 is provided in the MRAM device 720. The ECC unit 740 may include an ECC encoder 741 and an ECC decoder 742. The ECC encoder 741 generates ECC parity by using write data Data received from the controller 710. The write data and the ECC parity are written to the MRAM cell array 730 and a write-verity operation is performed on the written information. The verify operation may be performed by the ECC decoder 742 and the write-read-verity operation may be repeatedly performed according to a result of the verification, for example, based on the number of error bits occurring in the written data. As the verification result is provided to the controller 710, the write-read-verity operation may be controlled. For example, the controller 71 may control a write operation such as information on validation of the ECC block including the ECC parity or information indicating the position of the data block based on a result of the verification. When no error bit occurs in the written data, information indicating the ECC block is invalidated is written in a valid field of the ECC block. In contrast, when an uncorrectable error occurs, the rewrite operation and the read-verify operation are performed again on the data. When only a correctable error occurs, the ECC block is validated. In the above description, the write-read-verity operation is controlled by the controller 510. However, the control of write-read-verity operation may be performed within the MRAM device 720 based on a result of the verification. In the write of the ECC parity, the validation information and the position information may be written together to the MRAM cell array 730.

FIG. 16B illustrates an example in which the ECC unit 740 is provided in the controller 710. The ECC unit 740 may include the ECC encoder 741 and the ECC decoder 742. The controller 710 provides data to the MRAM device 720 and also provides ECC parity generated by the ECC encoder 741 to the MRAM device 720. The MRAM device 720 writes the received data and ECC parity to the MRAM cell array 730.

Then, a read operation is performed on the MRAM cell array 730 and the read data is provided to the controller 710. The controller 710 performs an error detection operation on the received data. When no error bit is detected, an ECC block where the ECC parity is stored is invalidated and the write operation is terminated. In contrast, when an uncorrectable error occurs, the rewrite operation and the read-verity operation are performed again on the data. When only a correctable error occurs, the write operation is terminated in a state in which the ECC block is validated.

Figure 17:
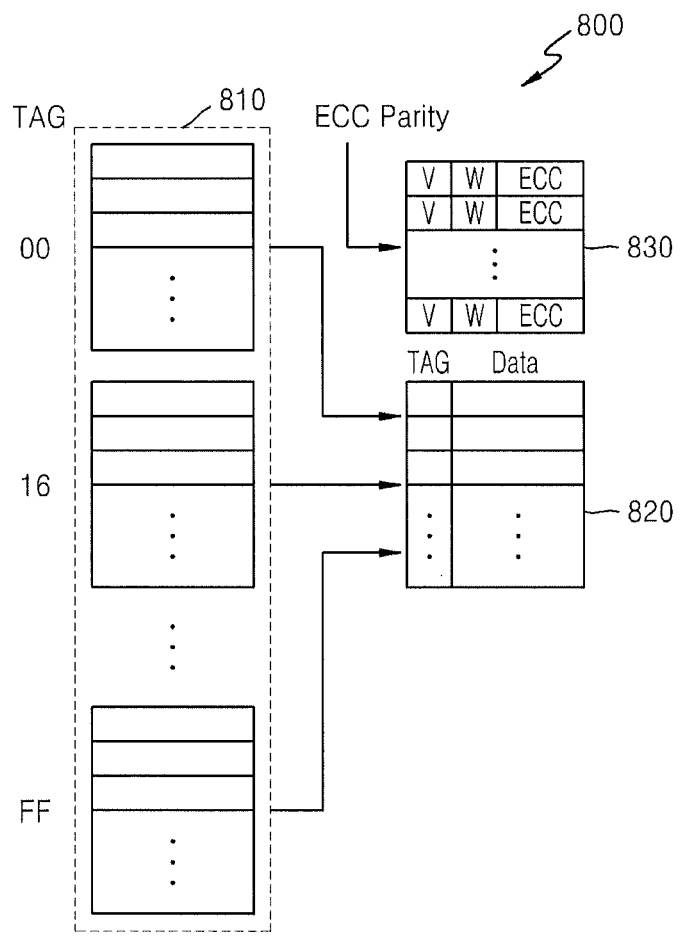
FIG. 17 is a block diagram schematically illustrating an example of a computer system according to another example embodiment of the present inventive concepts.

FIG. 17 is a block diagram schematically illustrating an example of a computer system 800 according to another example embodiment of the present inventive concepts. In FIG. 17, a direct mapping method is applied between a main memory 810 and cache memories 820 and 830.

Referring to FIG. 17, the computer system 800 may include the main memory 810 and the cache memories 820 and 830. The cache memories 820 and 830 includes a data region 820 to which data of the main memory 810 is copied and an ECC region 830 for storing ECC parity for data error correction.

The main memory 810 is divided into a plurality of sections having a desired (or, alternatively a predetermined) size, for example, into sections having the same size as the data in entries of the data region 820. A tag value is set for each divided section of the main memory 810. For example, a tag value of a first section of the main memory 810 is set to "00" and a tag value of a second section is set to "01".

Also, each section of the main memory 810 includes a plurality of lines. Each line may be a unit of data that is copied from the main memory 810 to the cache memories 820 and 830. Although it is not illustrated in FIG. 17, information indicating the position of a line of each section of the main memory 810, for example, index information, may be set. Also, a word field for mapping in units of bytes with respect to each line may be further used.

When there is a request to copy data of the main memory 810 to the cache memories 820 and 830, the data and a tag value corresponding to the data are written to the data region 820. Also, ECC parity corresponding to the data is generated and the generated ECC parity is written to an ECC field in the ECC region 830. Also, invalidation information about an ECC block where the ECC parity is written and position information indicating the position of a data block or a line corresponding to the ECC block are further written to the ECC block.

Each of a plurality of lines included in the data region 820 may correspond to the data block in the above-described example embodiment. Also, the ECC region 830 may include one or more lines and each line may include one or more ECC blocks. Although FIG. 17 illustrates that one line of the ECC region 830 includes one ECC block, it is possible to include two or more ECC blocks.

One ECC block of the ECC region 830 may be shared by two lines of the data region 820. In other words, when no error bit occurs during the write of data to the lines of the data region 820, an ECC block is not assigned to a line where an error bit does not occur, or the ECC block is invalidated. In contrast, an ECC block is assigned to a line where a correctable error bit occurs. Position information, e.g., index information, and invalidation information about an assigned line in addition to the ECC parity are further written to the ECC block. In other words, way field information that may be included in the ECC block may include index information indicating the position of a line of the data region 820.

Figure 18:
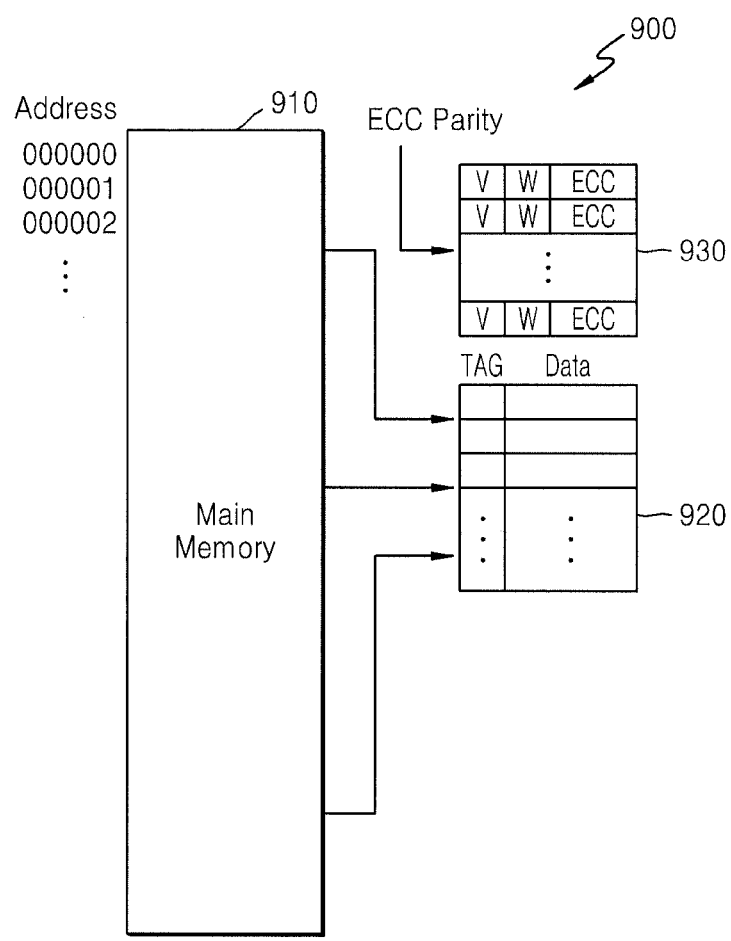
FIG. 18 is a block diagram schematically illustrating an example of a cache memory according to another example embodiment of the present inventive concepts.

FIG. 18 is a block diagram schematically illustrating an example of cache memories 920 and 930 according to another example embodiment of the present inventive concepts. FIG. 18 illustrates an example in which an associative mapping method is applied between a main memory 910 and the cache memory 920 and 930.

Referring to FIG. 18, a computer system 900 may include the main memory 910 and the cache memories 920 and 930. The cache memories 920 and 930 include a data region 920 to which data of the main memory 910 is copied and an ECC region 930 for storing ECC parity for data error correction.

The main memory 910 includes a plurality of sections and an address is assigned to each section. When data of the main memory 910 is copied to the cache memories 920 and 930, the data and an address of the section may be written to the data region 920 as a tag value.

When there is a request to copy the data of the main memory 910 to the cache memories 920 and 930, the data and the tag value corresponding to the data are written to the data region 920. Also, when ECC parity corresponding to the data is generated, the generated ECC parity is written to the ECC block of the ECC region 930. Also, invalidation information about an ECC block where the ECC parity is written is further written to the ECC block. Position information indicating the position of a data block corresponding to the ECC block is further written to the ECC block. The position of the data block may be an address of the main memory 910 and accordingly address information about the main memory 910 may be further written to the ECC block.

In the example embodiments of FIGS. 17 and 18, the tag value is further written to the data region 920 and the validation information and the position information are further written to the ECC region 930. However, as in the above-described example embodiments, an additional cell array is further provided in the cache memory and thus the tag value, the validation information, and the position information may be written to the additional cell array.

Figure 19:
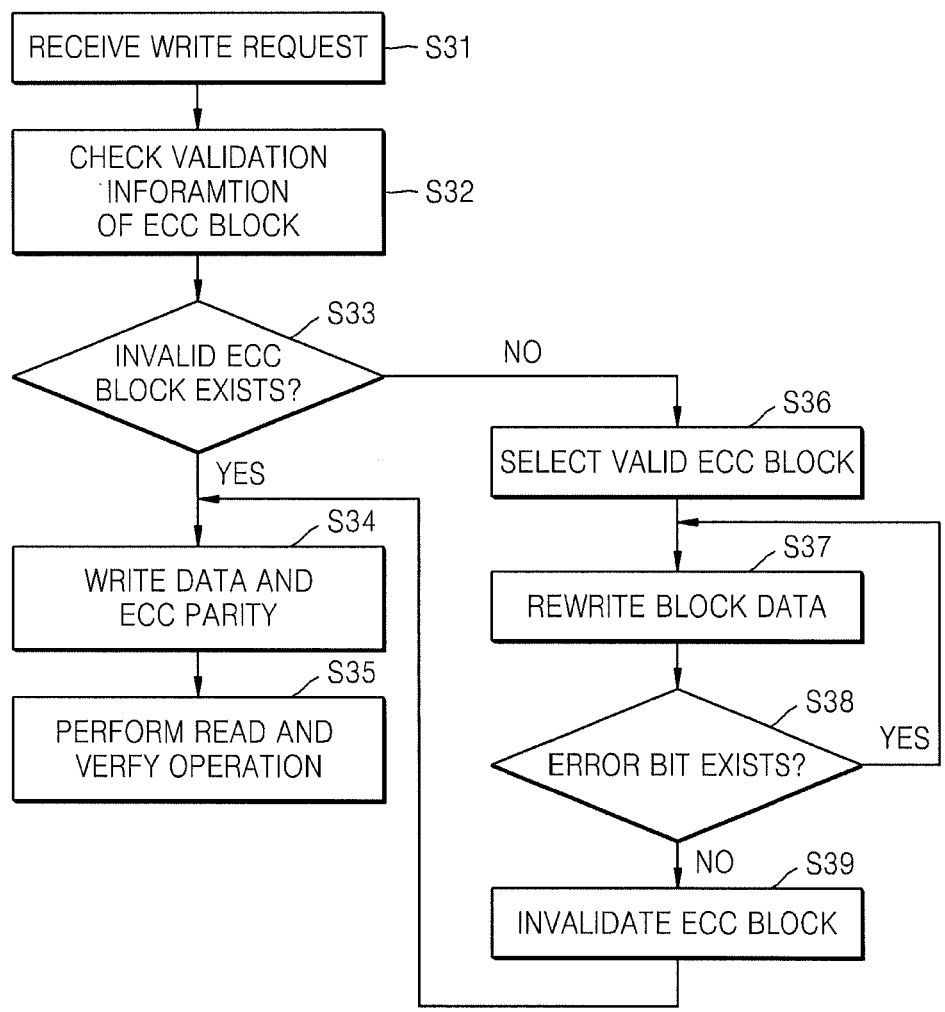
FIG. 19 is a flowchart for explaining a method of operating a cache memory according to another example embodiment of the present inventive concepts.

FIG. 19 is a flowchart for explaining a method of operating a cache memory according to another example embodiment of the present inventive concepts. FIG. 19 illustrates an example of an operation of writing data when all ECC blocks included in the cache memory are valid.

First, a cache memory receives a write request (S31). In order to write ECC parity corresponding to write requested data to an ECC block, it is checked whether a usable ECC block exists. For example, whether each ECC block validly stores ECC parity for ECC error correction is checked by checking validation information about an ECC block (S32).

It is determined according to a result of the checking whether an invalid ECC block exists (S33). When an invalid ECC block exists as a result of the determination, write requested data and ECC parity corresponding thereto are written (S34). A read-verity operation for detecting the number of error bits is performed by reading out the written data (S35). Then, as in the above-described example embodiments, when no error bit occurs, the ECC block is invalidated. Also, when only a correctable error occurs, the ECC block is validated.

In contrast, when it is determined that no invalid ECC block exists, any one data block and a valid ECC block corresponding thereto are selected (S36). For example, the selection may be randomly. An operation of rewriting data or block data is performed on the selected data block (S37). It is detected whether an error bit exists through a verification operation by reading out the rewritten data (S38). When an error bit exists as a result of the detection, an operation of rewriting block data is repeated. In other words, to invalidate an ECC block corresponding to the selected data block, the block data rewrite operation is performed even when only a correctable error occurs.

When an error bit does not occur in the data as a result of the rewrite, the ECC block is invalidated (S39) and ECC parity of the write requested data is written to the invalidated ECC block. Then, the read-verify operation is performed on the written data.

Figure 20A:
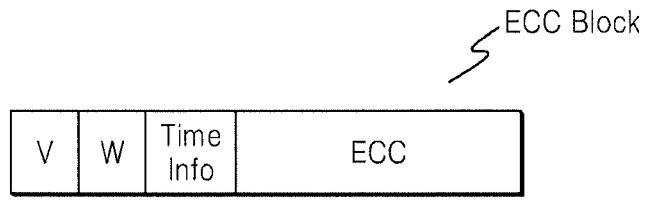
FIGS. 20A and 20B are respectively a block diagram and a flowchart for illustrating and explaining a method of operating a cache memory according to another example embodiment of the present inventive concepts.
Figure 20B:
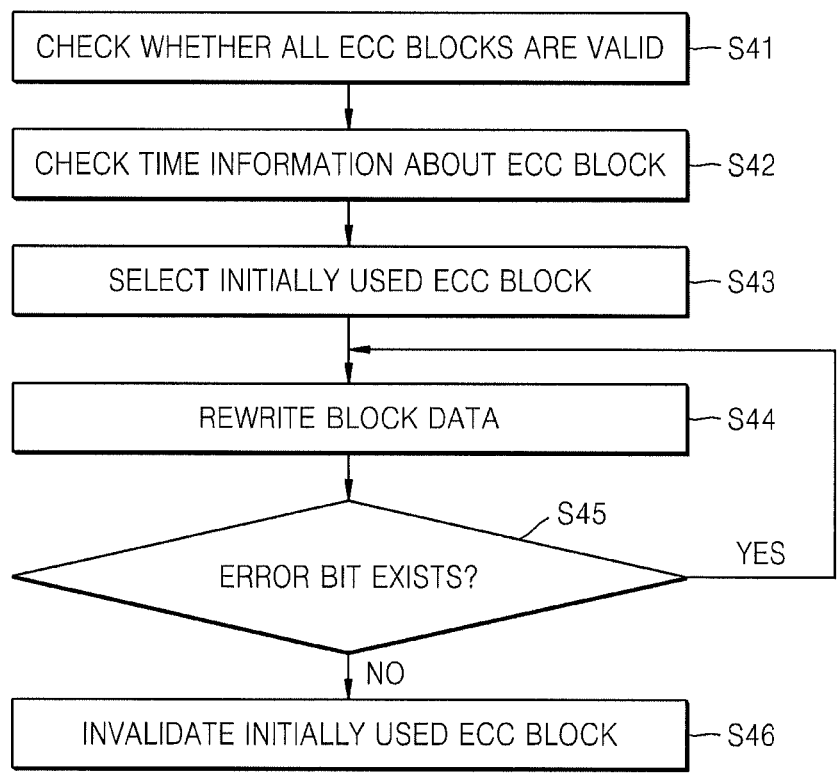

FIGS. 20A and 20B are respectively a block diagram and a flowchart for illustrating and explaining a method of operating a cache memory according to another example embodiment of the present inventive concepts. FIGS. 20A and 20B illustrate an example of an operation of writing data when the ECC blocks included in the cache memory are all valid. While FIG. 19 illustrates the operation of selecting any one of the valid ECC blocks (e.g., randomly selecting), FIGS. 20A and 20B illustrate an example of selecting a particular ECC block according to the use status of each ECC block.

Referring to FIG. 20A, in addition to the validation information, the position information, and the ECC parity, time information Time Info indicating the time when the ECC parity is stored, or the time when the ECC block is validated, is further stored in the ECC block. The time information may be information indicating the order of validation of a plurality of ECC blocks. For example, the time information may be a count value. Each time a new valid ECC block is added, the newly added block is given a count value of 1 and the count values of the other valid ECC blocks are incremented. Accordingly, the ECC block with the highest count value is the oldest ECC block. Of course, other methods for tracking or indicating the oldest ECC block may be used instead.

Referring to FIG. 20B, it is checked whether all ECC blocks in the cache memory are valid (S41). When all ECC blocks are valid as a result of the checking, time information stored in each of the ECC blocks is checked (S42). The oldest validated one of the ECC blocks is selected (S43). An operation of rewriting data or block data of the data block to the selected ECC block is performed (S44). Then, it is detected whether an error bit exists in the rewritten data (S45).

As in the above-described example embodiments, in order to invalidate the selected ECC block, no error bit needs to occur in the rewritten data. Accordingly, when an error bit exists, the data rewrite operation is repeated. When no error bit occurs in the rewritten data, the selected ECC block or initially validated ECC block is invalidated.

The invalidation operation on an ECC block described in the example embodiments of FIGS. 19, 20A, and 20B may be performed in a variety of forms. For example, when it is determined that all ECC blocks are valid, one ECC block may be selected and invalidated by randomly selecting any one of the ECC blocks or by selecting any one of the ECC blocks by using other information, for example, the time information before receiving a subsequent write request. Also, when a write request is received in a state in which all ECC blocks are valid, all ECC blocks may be determined to be valid in the process of searching an ECC block that is invalid. One ECC block may be randomly selected or selected by using other information as a result of the determination and an invalidation operation may be performed on the selected ECC block. Although in the above example one ECC block is selected, it is possible to select two or more ECC blocks and the invalidation operation is performed thereon.

Figure 21:
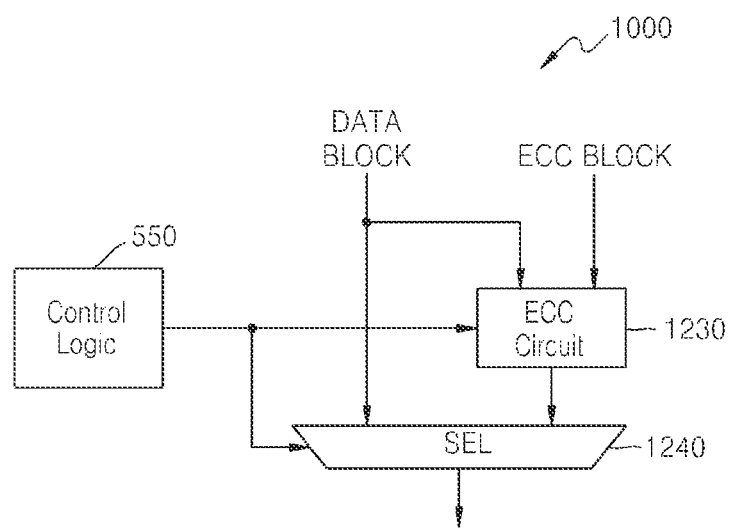
FIG. 21 is a block diagram schematically illustrating another example of an MRAM device for an operation of a cache memory according to an example embodiment of the present inventive concepts.

FIG. 21 is a block diagram schematically illustrating another example of an MRAM device 1000 for an operation of a cache memory according to an example embodiment of the present inventive concept. FIG. 21 illustrates an example related to an operation of skipping ECC correction based on information about an ECC block during data reading.

The MRAM device 1000 may be the same as the MRAM device 500 except for further including the ECC circuit 1230 and the selector 1240. For clarity and ease of description, only the control logic 550 from the MRAM device 500 is illustrated in FIG. 21.

During a read operation, the read data block is supplied from the buffer 534 to the ECC circuit 1230 and the selector 1240. Also, if an ECC block is read, then the ECC block is supplied from the buffer 624 to the ECC circuit 1230. As described with respect to FIG. 13, the control logic 550 determines whether a valid ECC block exists in association with the read data block. If a valid ECC block exists, then the control logic 550 enables operation of the ECC circuit 1230. Accordingly, the ECC circuit 1230 performs error correction on the data block using the parity information from the ECC block. The corrected data block is supplied to the selector 1240. Here, the control logic 550 also control the selector 1240 to output the corrected data block instead of the uncorrected data block.

If the control logic 550 does not detect a valid ECC block associated with the read data block, then the control logic 550 does not enable the ECC circuit 1230 and controls the selector 1240 to output the uncorrected data block.

As described above, in the semiconductor memory device including a non-volatile memory, the cache memory including the semiconductor memory device, and the computer system including the cache memory, according to the present inventive concepts, since a write operation is not repeatedly performed when a correctable error bit occurs during writing data, the time needed for a data write operation may be reduced. Also, since a space for storing ECC parity used for error correction may be reduced, a degree of integration may be improved.

While the inventive concepts has been particularly shown and described with reference to example embodiments thereof, it will be understood that various changes in form and details may be made therein without departing from the spirit and scope of the following claims.

We claim:

1. A method of reading data, comprising:
   receiving a request to read data from one of a first number of data blocks;
   scanning an ECC region containing a second number of ECC blocks for block identification information indicating whether any of the second number of ECC blocks correspond to the requested data block; and
   if one of the second number of ECC blocks is associated with the requested data block,
      determining from the block identification information which one of Hall the second number of ECC blocks is associated with the requested data block, the second number being less than the first number;
      simultaneously reading the requested data block and an ECC parity from the associated ECC block; and
      selectively performing error correction on the read data block using the requested data block and the ECC parity associated with the ECC block based on whether one of the ECC blocks is associated with the requested data block.

2. The method of claim 1, wherein each of the ECC blocks is associated with one of the data blocks such that at least one of the data blocks does not have an associated ECC block.

3. The method of claim 1, wherein the block information indicates which one of the second number of ECC blocks corresponds to the first number of data blocks.

4. The method of claim 1, further comprising:
   storing the block identification information in different ones of a plurality of memory cell arrays.

5. A method of storing data, comprising:
   receiving a request to write received data to a selected one of a first number of data blocks;

determining if an invalid error correction (ECC) block in a second number of ECC blocks exists in response to the request, the second number of ECC blocks being associated with the first number of data blocks; and if the invalid ECC block does not exist,
- removing errors from data in another of the first number of data blocks such that no errors in reading the another data block exist;
- invalidating the ECC block associated with the another data block;
- writing the received data in the selected data block;
- writing ECC data associated with the received data into the invalidated ECC block; and
- changing a state of the invalidated ECC block to valid.

6. The method of claim 5, wherein the second number is less than the first number.

7. The method of claim 5, wherein the changing stores validity information in association with the invalidated ECC block.

8. The method of claim 7, wherein the timing information is a count value, and the storing timing information includes changing the count value associated with other valid ECC blocks.

9. The method of claim 8, wherein the removing removes errors from one of the first number of data blocks associated with one of the ECC block having a highest count value.

10. The method of claim 7, wherein the removing removes errors from a one of the first number of data blocks corresponding to an oldest ECC block as indicated by the timing information.

11. The method of claim 5, wherein if the invalid ECC block does not exist, further comprising:
- storing block identification information in association with the valid ECC block, the block identification information indicating to which of the first number of data blocks the valid ECC block corresponds.

12. The method of claim 11, wherein if the invalid ECC block does not exist, further comprising:
- storing timing information in association with the valid ECC block, the timing information indicating an age of an associated one of the ECC blocks relative to others of the ECC blocks.

13. The method of claim 5, wherein the removing randomly selects the another data block.

14. The method of claim 5, wherein if the invalid ECC block does exist,
- writing the received data to the selected data block;
- writing ECC data associated with the received data to an invalid one of the ECC blocks;
- determining if the written data includes errors; and
- invalidating the ECC block in which the ECC data was written if the determining determines that the written data does not include errors.

15. The method of claim 14, wherein if the determining determines the written data does include errors,
- determining if the errors are not correctable by the ECC data; and
- correcting at least one of the errors in the written data if the errors are determined not to be correctable.

16. The method of claim 15, further comprising:
- validating the ECC block if the errors are determined to be correctable.

17. A method of storing data, comprising:
- receiving a request to write received data to a selected one of a first number of data blocks;
- writing the received data to the selected data block;
- writing ECC data associated with the received data to one of a second number of ECC blocks;
- determining if the written data includes errors that are not correctable by the ECC data;
- if the written data includes errors that are correctable by the ECC data,
  - completing the writing of the received data to the selected data block, and
  - maintaining a respective ECC block of the second number of ECC blocks in a valid state; and
- if the written data includes errors that are not correctable by the ECC data,
  - rewriting the received data and an ECC parity corresponding to the respective ECC block,
  - performing a read-verify operation after the rewrite, and
  - changing the valid state of the respective ECC block to an invalid state, if the read-verify operation indicates that the rewriting has corrected the errors in the written data.

18. The method of claim 17, wherein the second number is less than the first number.

* * * * *